United States Patent
Barbour et al.

(10) Patent No.: US 12,342,648 B2
(45) Date of Patent: Jun. 24, 2025

(54) SPATIAL PHASE INTEGRATED WAFER-LEVEL IMAGING

(71) Applicant: Photon-X, Inc., Kissimmee, FL (US)

(72) Inventors: Blair Barbour, Windemere, FL (US); David Theodore Truch, Katy, TX (US); Nicholas Englert, Orlando, FL (US)

(73) Assignee: Photon-X, Inc., Kissimmee, FL (US)

( * ) Notice: Subject to any disclaimer, the term of this patent is extended or adjusted under 35 U.S.C. 154(b) by 432 days.

(21) Appl. No.: 17/527,799

(22) Filed: Nov. 16, 2021

(65) Prior Publication Data

US 2022/0336511 A1 Oct. 20, 2022

Related U.S. Application Data

(63) Continuation of application No. PCT/US2020/033101, filed on May 15, 2020.
(Continued)

(51) Int. Cl.
*H10F 39/00* (2025.01)
*H04N 25/702* (2023.01)
(Continued)

(52) U.S. Cl.
CPC ......... *H10F 39/806* (2025.01); *H04N 25/702* (2023.01); *H04N 25/75* (2023.01);
(Continued)

(58) Field of Classification Search
CPC ............ H01L 21/67288; H04N 25/702; H04N 25/75; H04N 13/275; H04N 13/30;
(Continued)

(56) References Cited

U.S. PATENT DOCUMENTS

| 5,890,095 A | 3/1999 | Barbour et al. |
| 6,163,365 A | 12/2000 | Takahashi |
(Continued)

FOREIGN PATENT DOCUMENTS

| CN | 106096634 A | * 11/2016 | ........... G06K 9/6215 |
| JP | 2008002949 | 1/2008 |
(Continued)

OTHER PUBLICATIONS

CN 106096634 A (Year: 2016).*
WIPO, International Search Report and Written Opinion mailed Aug. 25, 2020, in PCT/US2020/033101, 9 pgs.

*Primary Examiner* — Jennifer D Bennett
*Assistant Examiner* — Erin R Garber
(74) *Attorney, Agent, or Firm* — Henry Patent Law Firm PLLC

(57) ABSTRACT

In a general aspect, integrated spatial phase wafer-level imaging is described. In some aspects, an integrated imaging system an integrated image sensor and an edge processor. The integrated image sensor may include: a polarizer pixel configured to filter electromagnetic (EM) radiation and to allow filtered EM radiation having a selected polarization state to pass therethrough; a radiation-sensing pixel configured to detect the filtered EM radiation and to generate a signal in response to detecting the filtered EM radiation; and readout circuitry configured to perform analog preprocessing on the signal generated by the radiation-sensing pixel. The edge processor may be configured to: generate first-order primitives and second-order primitives based on the analog preprocessed signal from the readout circuitry; and determine a plurality of features of an object located in a field-of-view of the radiation-sensing pixel based on the first-order primitives and the second-order primitives.

34 Claims, 22 Drawing Sheets

Related U.S. Application Data

(60) Provisional application No. 62/849,468, filed on May 17, 2019.

(51) Int. Cl.
  *H04N 25/75* (2023.01)
  *H10D 99/00* (2025.01)
  *H10F 39/18* (2025.01)
  *H10F 77/40* (2025.01)
  *H10K 39/32* (2023.01)
  *H10F 39/12* (2025.01)

(52) U.S. Cl.
  CPC ........... *H10D 99/00* (2025.01); *H10F 39/024* (2025.01); *H10F 39/026* (2025.01); *H10F 39/18* (2025.01); *H10F 39/80* (2025.01); *H10F 39/8057* (2025.01); *H10F 39/8063* (2025.01); *H10F 77/40* (2025.01); *H10K 39/32* (2023.02); *H10F 39/184* (2025.01); *H10F 39/199* (2025.01)

(58) Field of Classification Search
  CPC ..... H04N 13/349; H10K 39/32; G01J 3/0224; G01J 3/2823
  See application file for complete search history.

(56) References Cited

U.S. PATENT DOCUMENTS

| | | | |
|---|---|---|---|
| 6,671,390 | B1 | 12/2003 | Barbour et al. |
| 6,810,141 | B2 | 10/2004 | Barbour |
| 8,023,724 | B2 | 9/2011 | Barbour |
| 8,320,661 | B2 | 11/2012 | Barbour |
| 8,736,670 | B2 | 5/2014 | Barbour et al. |
| 9,693,728 | B2 | 7/2017 | Harry et al. |
| 9,736,670 | B2 | 7/2017 | Harry et al. |
| 10,396,117 | B2 * | 8/2019 | Onal ................. H01L 27/14641 |
| 10,910,364 | B2 * | 2/2021 | Or-Bach ................. H10B 41/20 |
| 2002/0181761 | A1 | 12/2002 | Barbour |
| 2003/0103674 | A1 | 6/2003 | Publicover |
| 2005/0163365 | A1 | 7/2005 | Barbour |
| 2005/0275746 | A1 * | 12/2005 | Nishida ................. G02B 13/008 257/E31.127 |
| 2005/0279917 | A1 * | 12/2005 | Barrett ................... G06V 10/88 250/208.1 |
| 2007/0046525 | A1 | 3/2007 | Holbrook et al. |
| 2011/0134220 | A1 | 6/2011 | Barbour et al. |
| 2014/0211193 | A1 | 7/2014 | Bloom et al. |
| 2015/0350583 | A1 * | 12/2015 | Mauritzson ....... H01L 27/14647 257/432 |
| 2016/0292908 | A1 | 10/2016 | Obert |
| 2017/0006233 | A1 | 1/2017 | Venkataraman et al. |
| 2017/0091897 | A1 | 3/2017 | Lee et al. |
| 2017/0098310 | A1 | 4/2017 | Chefd'Hotel et al. |
| 2017/0163873 | A1 * | 6/2017 | Kim ................... H04N 25/704 |
| 2017/0345222 | A1 | 11/2017 | Cohen-Or et al. |
| 2019/0006407 | A1 * | 1/2019 | Uesaka ............. H01L 27/14645 |
| 2019/0178968 | A1 | 6/2019 | Cetingul |
| 2019/0206927 | A1 * | 7/2019 | Lee .................... H01L 25/0753 |
| 2019/0258878 | A1 | 8/2019 | Koivisto et al. |
| 2020/0168650 | A1 * | 5/2020 | Nakamura ....... H01L 27/14629 |
| 2020/0301053 | A1 * | 9/2020 | Wang .................... G01J 3/2823 |
| 2020/0344430 | A1 * | 10/2020 | Wang ................. H01L 27/14621 |
| 2022/0103797 | A1 | 3/2022 | Barbour et al. |

FOREIGN PATENT DOCUMENTS

| | | |
|---|---|---|
| KR | 20000005409 | 1/2000 |
| KR | 20150069617 | 6/2015 |
| WO | 1997037336 | 10/1997 |
| WO | 2012053811 | 4/2012 |
| WO | 2018213841 | 11/2018 |
| WO | 2020163742 | 8/2020 |
| WO | 2020236575 | 11/2020 |
| WO | 2021030454 | 2/2021 |
| WO | 2021067665 | 4/2021 |

* cited by examiner

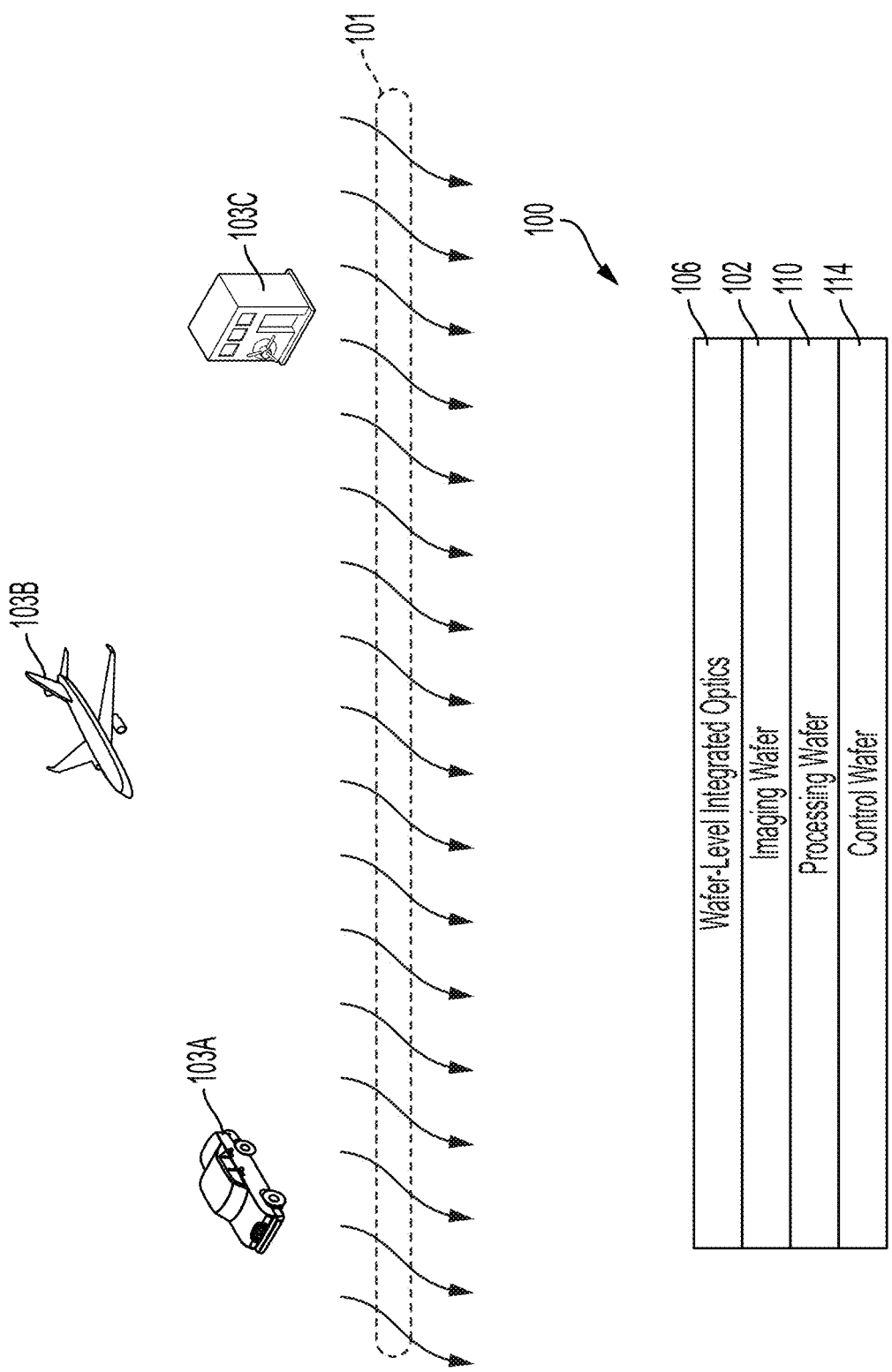

SPATIAL PHASE INTEGRATED WAFER-LEVEL IMAGING

CROSS-REFERENCE TO RELATED APPLICATIONS

The present application claims priority to U.S. Provisional Patent Application Ser. No. 62/849,468, filed May 17, 2019, entitled "Spatial Phase Shape Based Image Sensors Patent" the disclosure of which is hereby incorporated by reference in its entirety.

BACKGROUND

The following description relates to spatial phase integrated wafer-level imaging.

Conventional imaging systems employ intensity-based techniques to detect electromagnetic energy proceeding from a source (e.g., an object). As one example of a conventional system, a spectroscopic system determines spectral (e.g., wavelength) composition of objects and scenes. Conventional imaging systems may not be suitable to generate 3D images or other angle representations of object shapes and scenes in real-time. Furthermore, conventional imaging systems may not be suitable in incoherent electromagnetic environments or turbid media (e.g., environments containing mist, fog, or smoke). Other imaging solutions may be needed to overcome the limited use of conventional imaging systems.

DESCRIPTION OF DRAWINGS

FIGS. 1A and 1B shows an example spatial phase integrated wafer-level imaging system.

DETAILED DESCRIPTION

Figure 1B:
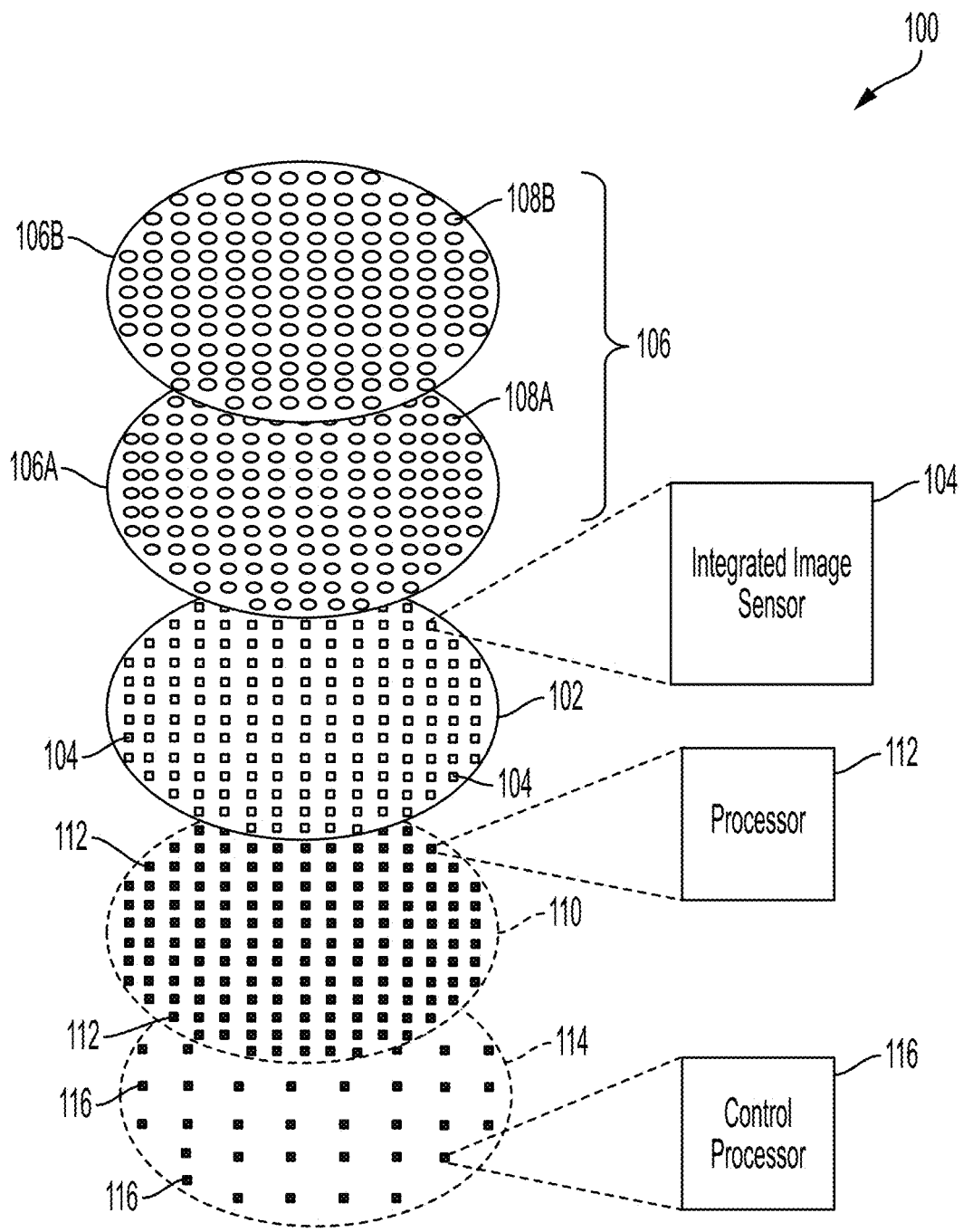

In some aspects of what is described here, an integrated imaging system includes a polarization structure that is formed over or within a pixel/photodiode of a sensor such as visible, LWIR, or another electromagnetic wavelength-based sensor. The polarization structure can be any of: a pixel-sized metal-wire grid polarization structure; one or more material constructs exhibiting birefringence; a structure including one or more meta-materials; antenna structures; aligned quantum dots; aligned carbon nanotubes; subwavelength structures other than meta-materials; and other structures. Each polarizer pixel of the polarization structure has a metal barrier that isolates one polarizer pixel from an adjacent one, reduces crosstalk between adjacent polarizer pixels, and increases the amount of metal used in the imaging system, thus improving polarization contrast and the efficiency of the polarization structure in filtering EM radiation having specific polarization states. Deep trenches are also formed for pixel-to-pixel isolation, to eliminate crosstalk between pixels and to increase current flow or magnetic flow in the polarizing grid or polarizing layer. These deep trenches are particularly useful in examples where the polarization structure is placed on top of the pixel/photodiode.

The polarization structure can be added to (e.g., placed on top of or incorporated within) any sensor, for example a CMOS sensor, by adding an additional step in its manufacturing process. In some examples, the polarization structure can be manufactured as an addition to an existing metal or contact layer. Any sensor with the polarization structure gives polarization as an extra degree of information that can be obtained from the scene, apart from the monochrome intensity values. Other information that can be obtained from the use of the polarization structure include color intensity values, long-wave infrared (LWIR) information, the degree of linear polarization (sometimes referenced as Nz or DoLP), angle of linear polarization (sometimes referenced as Nxy or AoP), depolarization factor (sometimes referenced as Nxyz), principal curvatures, mean curvature, Gaussian curvature, synthetic skin or lighting, unpolarized scatter, ellipticity, albedo, the index of refraction, material types, cluster of angles, surface angles, slope, rate of slope, surface scattering, specular/diffuse scattering, propagation scattering, pixel-to-pixel clusters, 3D object or scene detection, distance tracking, scene reconstruction, object mapping, surface characterization, just to name a few.

The proposed imaging system also performs analog processing on the intensity values of the different polarization states before converting them into digital form, thus reducing its quantization error and improving the signal-to-noise ratio (SNR). Specifically, the imaging system can use-on the system's readout electronics and embedded edge processors-analog math of core polarization parameters, which removes more actual noise obtained from reading the surface angles. The imaging system can subsequently digitize only the resulting differences and sums of the core polarization values, and the core 3D normal can be done in the edge processors.

In some examples, an optical sensor, computer chips, and other electronic circuitry can be built on semiconductor wafers. The optical sensor wafer, a processing wafer (including edge processors), and a control wafer (including control processors) can all be bonded together into a light weight, low power, compact design. The resultant imaging system also has high resolution for long ranges.

FIGS. 1A and 1B show an example of a spatial phase integrated wafer-level imaging system 100. The imaging system 100 is developed out of stacking wafers, and FIG. 1A is a side-view of the various wafers of the imaging system 100, while FIG. 1B shows an exploded view of the various wafers imaging system 100. As seen in the example of FIGS. 1A and 1B, the imaging system 100 may include an imaging wafer 102, wafer-level integrated optics 106 stacked on the imaging wafer 102, a processing wafer 110 attached to another side of the imaging wafer 102, and a control wafer 114 attached to a backside of the processing wafer 110. The whole or a part of the stacked wafers creates the spatial phase integrated wafer-level imaging system 100. By stacking wafers, more integrated sensors in a smaller, more cost-effective package may be developed. The imaging system 100 may be sensitive to electromagnetic (EM) radiation 101 that is incident upon it. In some implementations, the imaging system 100 is sensitive to the magnetic vector of the EM radiation 101, to the electric vector of the EM radiation 101, or to both. The EM radiation 101 incident on the imaging system 100 may be incoherent illumination, active or passive illumination, and may occur in any band of the EM spectrum. Furthermore, depending on the type of image sensors used in the imaging wafer 102, the choice of materials used in the pixel elements of the imaging wafer 102, and the line space and widths of the polarization structure used in the imaging wafer 102, the imaging system 100 may be sensitive to (e.g., tuned to be sensitive to) the visible light range, the near infrared (NIR) range, the infrared range (e.g., short-wave infrared (SWIR), mid-wave infrared (MWIR), LWIR), the ultraviolet (UV) range, the microwave range, the x-ray range, the gamma ray range, the radio frequency range, radiation in the terahertz (THz) range, etc.

Figure 1C:
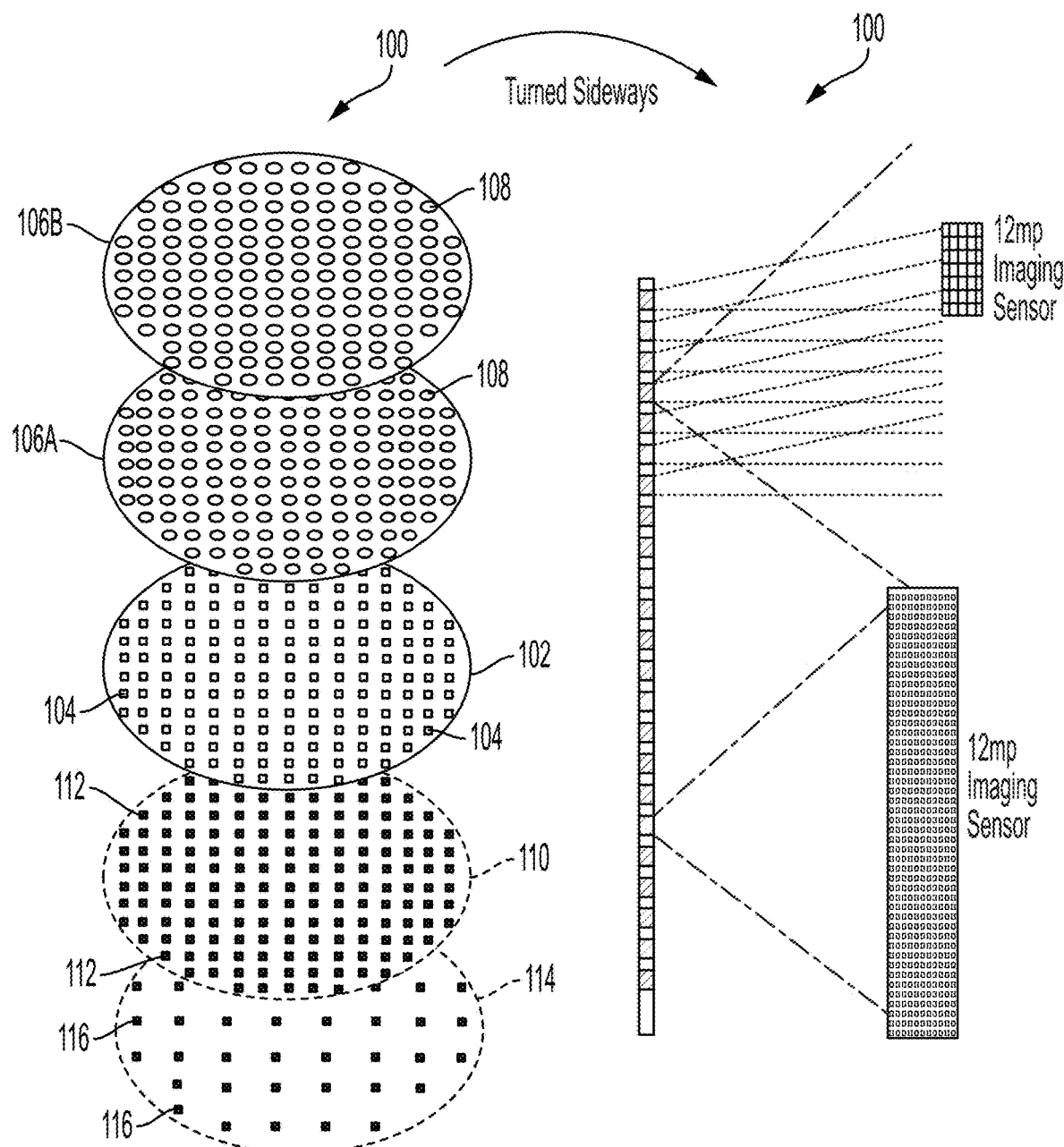
FIG. 1C shows an example where different pixel sizes, focal lengths, and image sensors can be interleaved within the same wafer-level imaging system.

In some implementations, pixels of different sizes, focal lengths, integration times, and different image sensors can be interleaved within the same wafer-level imaging system 100, as seen in the example of FIG. 1C. As an example, one or more LWIR bolometers can be placed on the same imaging wafer 102 as silicon CMOS visible/NIR imagers. As a further example, different pixel sizes can be mixed with cells of pixels to create a sensor having wide dynamic range and strong angle sensitivity across the image.

Figure 1D:
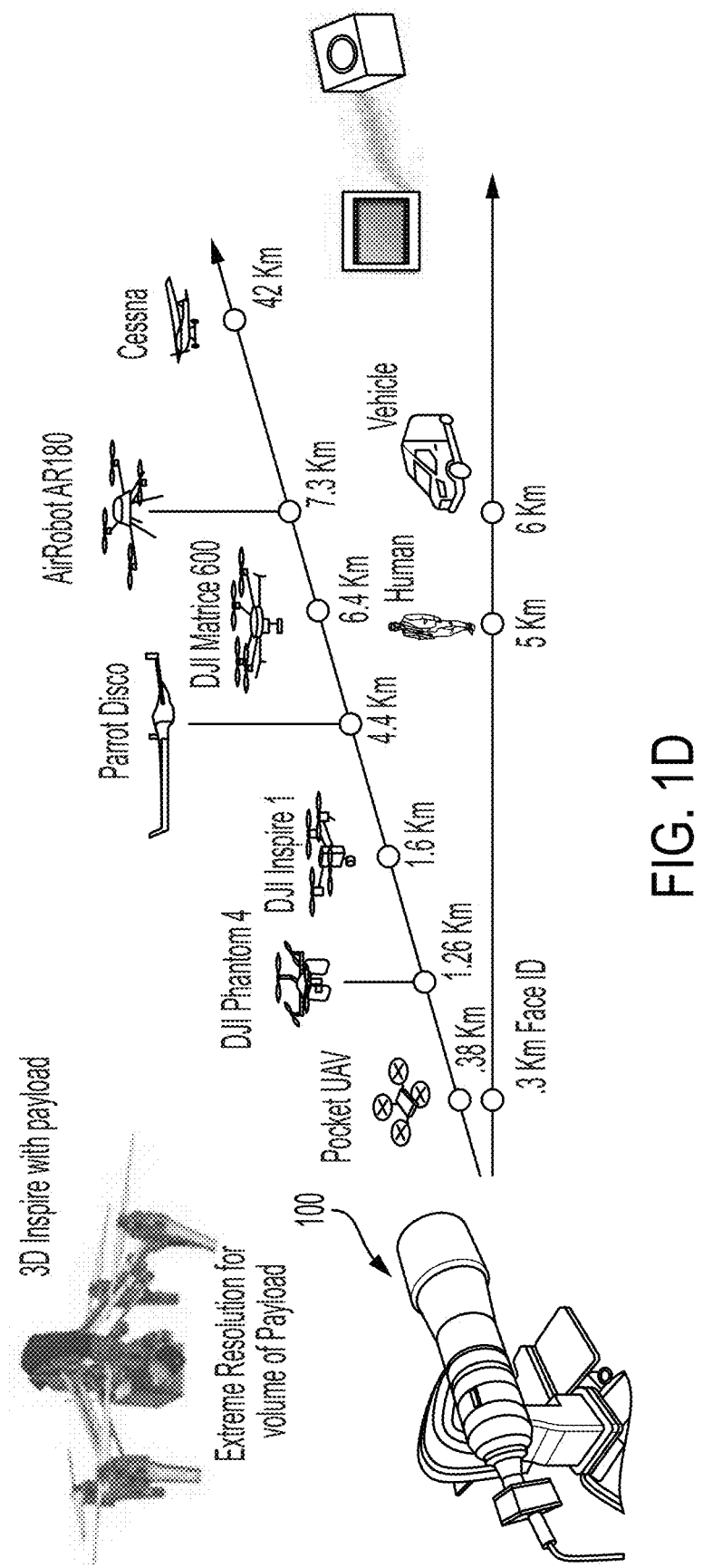
FIG. 1D shows an example imaging system that can identify, track, and analyze objects and scenes in three dimensions and at various distances.
Figure 8:
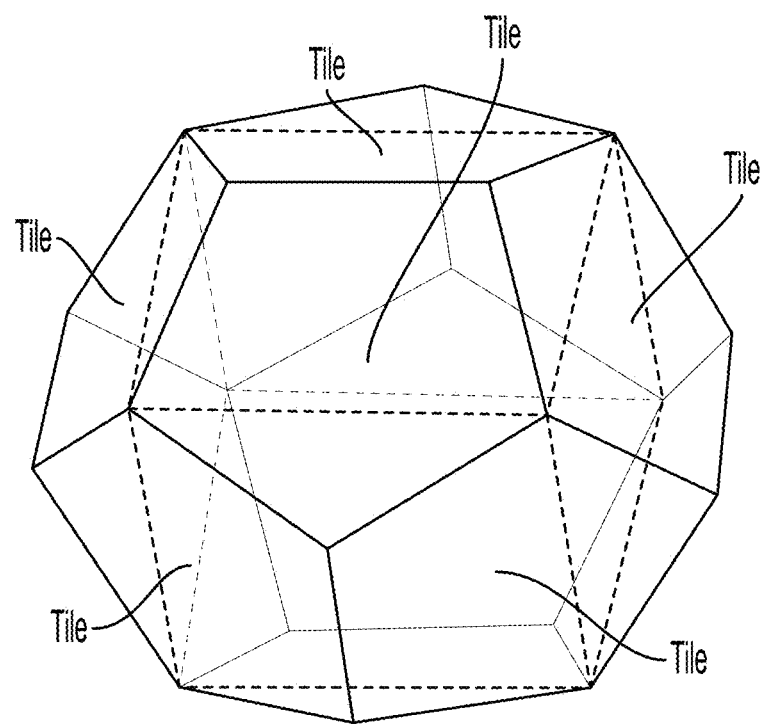
FIG. 8 shows an example where multiple tiles are spatially arranged to have a 360-degree solid-state view or radar of an environment.

In some examples, the wafer array of the imaging system 100 can be cut or diced into a variety of shapes and embedded in a variety of form factors depending upon the application and the desired coverage and precision. As an example, the wafer array can be cut or diced into tiles having any form or size. The tiles can be subsequently flexed and arranged next to each other or used by itself to form any shape on any surface, for example, a 360-degree dome as seen in FIG. 8, a linear array, a single tile that forms a smart phone lens, a single tile that is placed on a gun site, a tiled approach that forms the surface "skin" of planes or other vehicles, etc. This approach can provide the imaging system 100 with the ability to identify, track, and analyze objects and scenes in 3D and at various distances, as shown in FIG. 1D.

In general, the EM radiation 101 interacts with one or more objects 103A, 103B, 103C and is subsequently received by the imaging system 100. The objects 103A, 103B, 103C may be any physical object in the real world, some examples being buildings, structures, a human body, scenes, terrains, astronomical bodies, planetary bodies, vehicles, among others. The EM radiation 101 may be emitted by the objects 103A, 103B, 103C, reflected off the objects 103A, 103B, 103C and directed toward the imaging system 100, transmitted through the objects 103A, 103B, 103C and directed toward the imaging system 100, or may be a combination thereof. In some implementations, the EM radiation 101 may include ambient EM energy that is reflected off, or emitted from the surface of the objects 103A, 103B, 103C or transmitted through the objects 103A, 103B, 103C. Additionally or alternatively, the EM radiation 101 may include EM energy that is projected onto the objects 103A, 103B, 103C by an EM energy source and reflected off, emitted from the surface of the objects 103A, 103B, 103C or transmitted through the objects 103A, 103B, 103C.

Figure 2A:
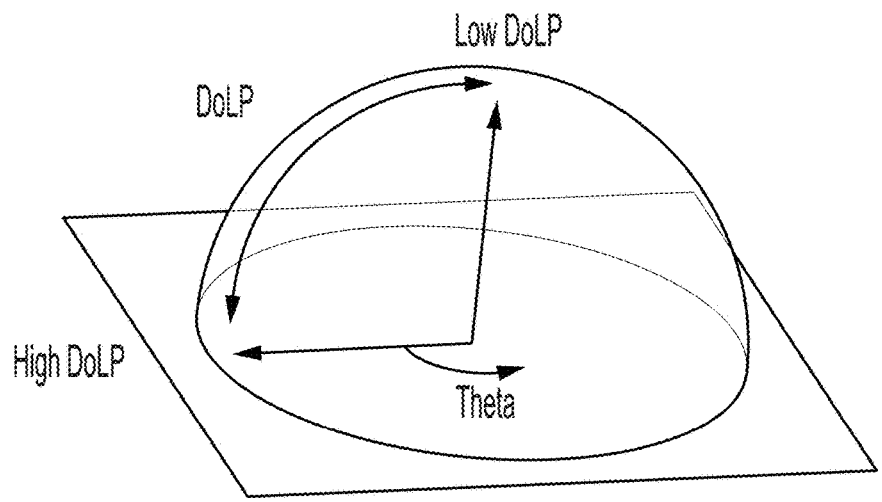
FIG. 2A shows an example of degrees of linear polarization of electromagnetic radiation and its correlation to a direction cosine of the electromagnetic radiation.
Figure 2B:
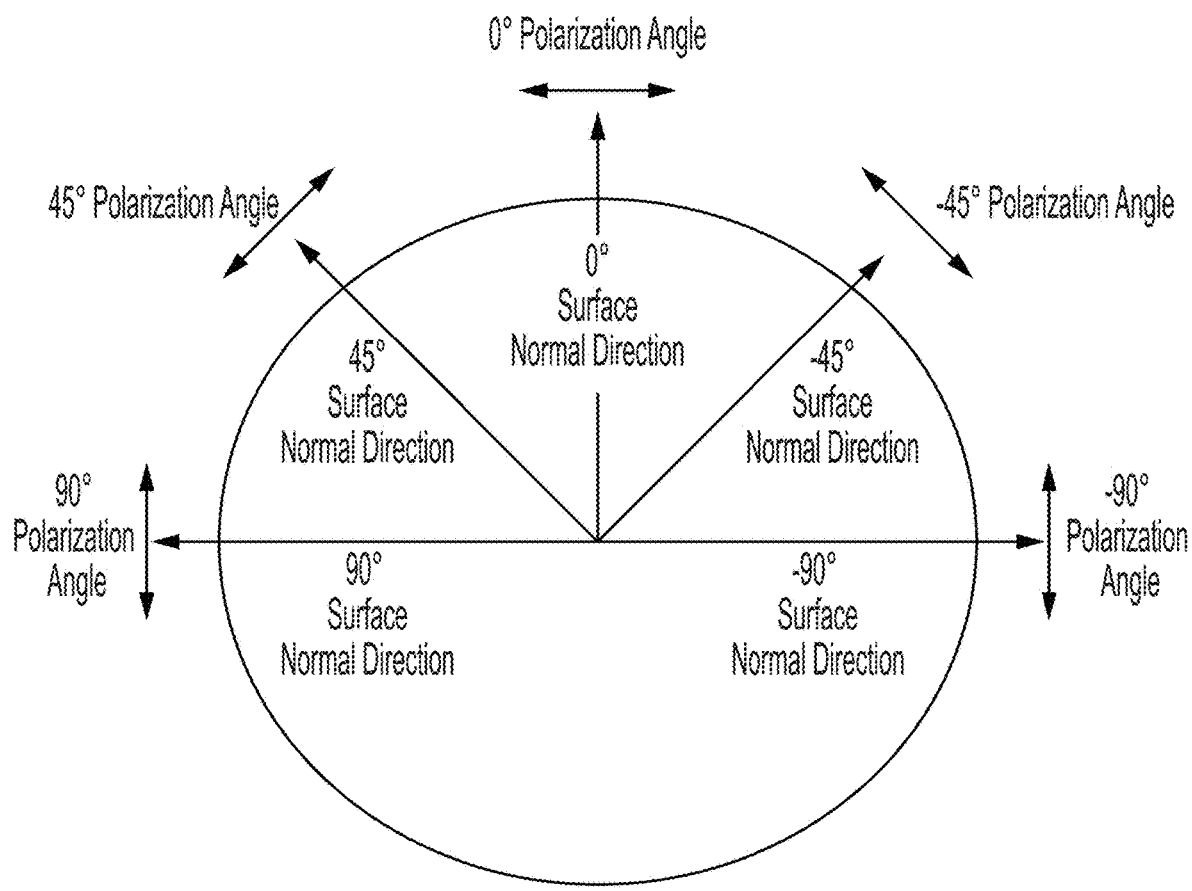
FIG. 2B shows an example of a correspondence between a direction of a surface normal of electromagnetic radiation and a polarization angle of the electromagnetic radiation.

Properties of the EM radiation 101 may be altered as it interacts with the objects 103A, 103B, 103C. FIG. 2A shows that after an interaction with the object 103A, for example, the percentage of linear polarization in the EM radiation 101 reflected from a surface of the object 103A (indicated in FIG. 2A as a degree of linear polarization, DoLP) may be directly correlated to the direction cosine of the original EM energy incident on the object 103A. Furthermore, the primary angle of the reflected linearly polarized light, which is indicated as Theta in FIG. 2A, may be mathematically related to the in-plane angle of the reflecting surface. FIG. 2B shows an example of a correspondence between a direction of a surface normal and a surface angle of the EM radiation 101. In the example shown in FIG. 2B, which is a specific example where the correlation is defined relative to a reference coordinate frame, a 90-degree polarization angle may correspond to a 90-degree surface normal direction; a 45-degree polarization angle may correspond to a 45-degree surface normal direction; a 0-degree polarization angle may correspond to a 0-degree surface normal direction; a-45-degree polarization angle may correspond to a-45-degree surface normal direction; and a-90-degree polarization angle may correspond to a-90-degree surface normal direction. While FIG. 2B shows five specific angles of polarization, the angles of polarization can be of any value between 0 degrees and 360 degrees, or multiples thereof. The example of FIG. 2B is merely illustrative and other correlations may be defined relative to other reference coordinate frame (e.g., relative to an object's surface or relative to a camera angle).

Since the EM radiation 101 incident on the imaging system 100 has properties that are indicative of its interaction with the objects 103A, 103B, 103C, the imaging system 100 can derive information about the objects 103A, 103B, 103C from the magnetic vector of the EM radiation 101, from the electric vector of the EM radiation 101, or from both. Such information about the objects 103A, 103B, 103C may include: the shapes and surface anomalies of the objects; surface roughness of the objects; material analysis of the objects; lighting analysis of the objects; the angles of various surfaces of the objects (e.g., expressed as surface normal vectors of the objects); edges, occlusions, blobs, masks, gradients, and interior volume features of the objects; surface/pixel geometry of the objects; a frequency distribution of the EM radiation 101 emanating from the objects; color information of objects; LWIR information of the objects; the degree of linear polarization, angle of linear polarization, depolarization factor, principal curvatures, mean curvature, Gaussian curvature, synthetic skin or lighting, unpolarized scatter, ellipticity, albedo, the index of refraction, material types, cluster of angles, surface angles, slope, rate of slope, surface scattering, specular/diffuse scattering, propagation scattering of the objects; pixel-to-pixel clusters; 3D object or scene detection; distance tracking; scene reconstruction; object mapping; surface characterization; and others. Therefore, the objects 103A, 103B, 103C may be represented by a broad number of parameters. By clustering similar features from the pixels, the system 100 can group the scene into different object types, thus enabling segmentation of the scene into those different object types. The application of this segmentation can be crucial for machine visioning applications. Segmentation at the angle and surface level can also be important in describing a surface or 3D object. By deriving information about the objects 103A, 103B, 103C, the imaging system 100 may also detect the presence of objects 103A, 103B, 103C and track or predict their motion (e.g., in the context of drone or object detection and tracking). Other applications of the imaging system 100 include predicting the rate of corrosion or blister growth, quality inspection and 3D scanning in an industrial environment, wound imaging and early skin cancer detection, 3D facial reconstruction and identification of an individual, autonomous navigation, among others.

The imaging system 100 includes the imaging wafer 102. In some implementations, the imaging wafer 102 has a diameter ranging from about 20 mm to about 500 mm. As examples, the imaging wafer 102 may be a semiconductor wafer having a diameter of about 25 mm, about 50 mm, about 75 mm, about 100 mm, about 125 mm, about 150 mm, about 200 mm, about 300 mm, or about 450 mm. The typical wafers can be either 200 mm or 300 mm for standard CMOS image sensor process flows. As mentioned above, the wafer can be cut into any size tile, such as a 10-by-10 image size which might correspond to a 2"×2" size tile, and these tiles can be placed on anything from gun sites to aircraft skin. As an example, the tiles can be tessellated to form a dome shape (e.g., as seen in FIG. 8) for a complete 360-degree coverage, but a small 2"×2" tile would serve as a good gun site.

The imaging wafer 102 includes an array of integrated image sensors 104. The image sensors 104 can be mixed or similar imager types, such as visible, NIR, Si SWIR, SWIR, MWIR, LWIR, UV, THz, X-ray, depth, spectral (Single, Multi, hyper), etc. As described in further detail below in FIGS. 3A, 3B, 4A, 4B, and 5, each integrated image sensor 104 includes an array of radiation-sensing pixels and a polarization structure. In some implementations, each integrated image sensor 104 can include additional layers, examples being color, multispectral, hyperspectral, polarization, lenslets, multiple types of other depth pixels or imagers, etc. In some implementations, the polarization structure is disposed over (e.g., placed on) the array of radiation-sensing pixels, while in other implementations (e.g., backside illuminated image sensors), the polarization structure is integrated into radiation-sensing pixels (e.g., at the anode or cathode level of the radiation-sensing pixels), as described in further detail below in FIGS. 11A to 11I. The number of integrated image sensors 104 formed on the imaging wafer 102 is not limited and can vary from a single image sensor to hundreds, thousands, or even millions of image sensors 104. The integrated image sensors 104 may be manufactured at any technology node (e.g., using any process from the 180 nm process down to the 5 nm process and beyond. In general, smaller technology nodes favor the manufacture of subwavelength structures that can function as the polarization structure, thereby changing the characteristics of the signal and thus polarization or angle data.

The imaging system 100 also includes wafer-level integrated optics 106 stacked on the imaging wafer 102. The wafer-level integrated optics 106 may include one or more optical wafers 106A, 106B to make a very small embedded lens (sometimes referred to as a lensless optical system). Only two optical wafers are shown in the example of FIG. 1B for the sake of illustration, and some implementations can include more than two optical wafers. Each optical wafer 106A, 106B respectively includes microlens arrays 108A, 108B distributed over the face of the wafer 106A, 106B and at each pixel level of an individual image sensor 104, which results in numerous image sensors 104 with separate lenses on each image sensor 104 in the array with the wafer optics. A respective microlens array 108 includes an array of microlenses and is placed above each integrated image sensor 104 to focus the EM radiation 101 directly to radiation-sensing pixels of the integrated image sensor 104, thereby reducing optical crosstalk between adjacent integrated image sensors 104. In some implementations, the microlens arrays 108 may include one or more coatings to reduce reflection, thus minimizing flares and ghost images while maximizing contrast and color rendition. In some implementations, the optical array can include an auto-aperture capability or other integrated camera components. The wafer-level integrated optics 106 and the microlens arrays 108A, 108B are configured to operate at any wavelength in the EM spectrum. For example, the wafer-level integrated optics 106 and the microlens arrays 108A, 108B can include any focusing element that focuses the EM radiation 101 directly to radiation-sensing pixels of the integrated image sensor 104. For example, the microlens arrays 108A, 108B can include a glass lens, a quartz lens, an element that produces magnetic pulses (which may be used in the high energy part of the EM spectrum), an antenna-based element (which may be used in the low energy part of the spectrum, for example, radio frequencies), or a combination thereof.

In a general aspect, each integrated image sensor 104 is sensitive to spatial phase of the EM radiation 101 incident upon it, and the imaging system 100 re-describes the objects 103A, 103B, 103C in terms of spatial phase data. In particular, the spatial phase of the EM radiation 101 emanating from the surfaces of the objects 103A, 103B, 103C, whether it is emitted, transmitted, or reflected, has a measurable spatial phase. Thus, the shapes of the objects 103A, 103B, 103C, the type of material from which it is made, the orientation of the objects 103A, 103B, 103C relative to the observer, etc., affect the spatial phase of the EM radiation 101 emanating from the objects 103A, 103B, 103C. As a result, each feature of the objects 103A, 103B, 103C has a distinct spatial phase signature. In an example, the EM radiation 101 exhibits unique orientations based on its interaction with the objects 103A, 103B, 103C and features thereof. As such, the EM radiation 101 contains information indicative of the interaction of EM energy with the objects 103A, 103B, 103C, and each integrated image sensor 104 may function as a shape-based sensor that is configured to passively capture spatial phase and radiometric information of the EM radiation 101 that is collected by the integrated image sensor 104.

Figure 3A:
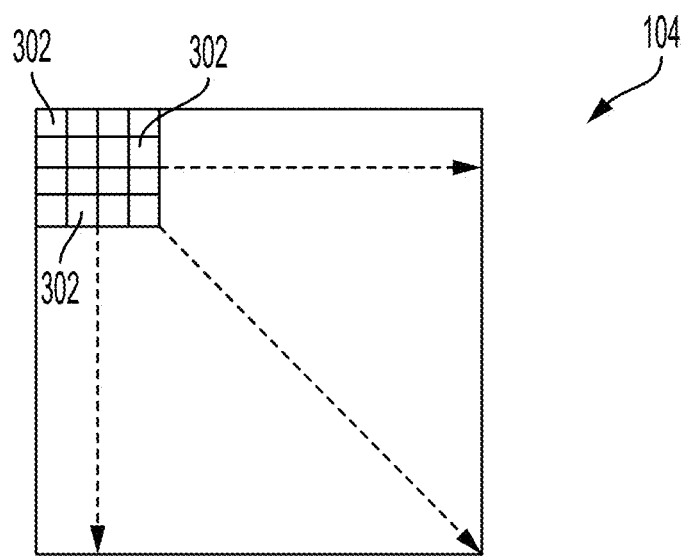
FIG. 3A shows a top-down view of an array of radiation-sensing pixels of an example integrated image sensor.

FIG. 3A shows a top-down view of an example integrated image sensor 104 having an array of radiation-sensing pixels 302 that are sensitive to the EM radiation 101 and orientations thereof. In some implementations, each integrated image sensor 104 may have millions of radiation-sensing pixels 302 (e.g., in a range from about 10 megapixels to about 30 megapixels, an example being 24 megapixels), with each radiation-sensing pixel 302 having any size (e.g., from 0.7 micrometer to 100 micrometer pixel sizes).

Depending on the type of pixel elements selected for the radiation-sensing pixels 302, the integrated image sensor 104 may be sensitive to colored EM radiation 101 (e.g., RGB color), monochrome EM radiation 101, or EM radiation 101 having other wavelength ranges such as visible light, NIR, SWIR, MWIR, LWIR, ultraviolet, microwaves, x-rays, gamma rays, radio frequencies, radiation in the terahertz range, depth, spectral (Single, Multi, hyper), etc. In some implementations, the integrated image sensor 104 may use a low-light visible sensor, which can provide higher resolution and greater low-light sensitivity compared to other types of sensors, thereby allowing the integrated image sensor 104 (and hence the system 100) to be used for day and most night capabilities. As an example, a low-light visible sensor may provide from about 60% to about 80% of the low-light capabilities of a LWIR sensor.

Figure 3B:
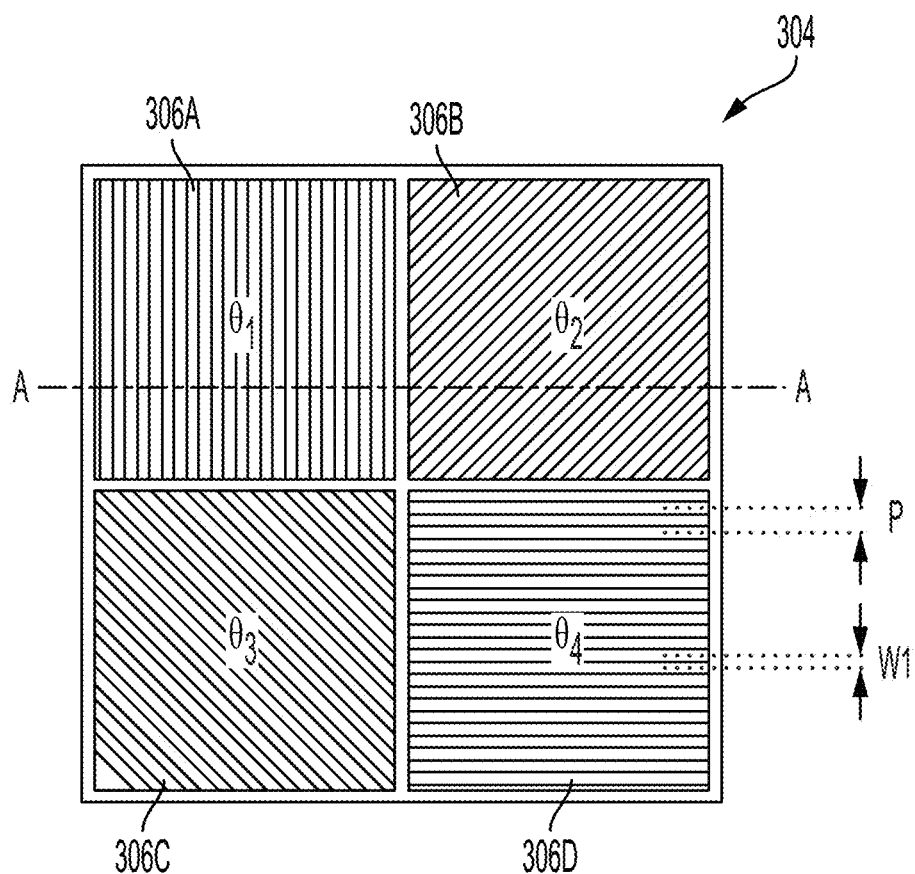
FIG. 3B shows a top-down view of a unit cell of a polarization structure of an example integrated image sensor.

FIG. 3B shows a top-down view of a unit cell 304 of a polarization structure of the integrated image sensor 104. In some implementations, the unit cell 304 of the polarization structure is formed by a 2×2 pattern of adjoining polarizer pixels 306A, 306B, 306C, 306D, although unit cells of other sizes are possible in other examples. The respective polarizer pixels 306A, 306B, 306C, 306D of the unit cell 304 allows only one polarization state of the EM radiation 101 to pass through to be detected by the radiation-sensing pixels 302. Therefore, the unit cell 304 functions as a filter for various polarization states of the EM radiation 101, thus substantially reducing noise in the EM radiation 101 and allowing the integrated image sensor 104 to generate spatial phase data having a high dynamic range. Such noise (e.g., scattering) in the EM radiation 101 may, as an example, be generated when the EM radiation 101 is emitted by, reflected off, or transmitted through various features (e.g., diffuse features) of the objects 103A, 103B, 103C. As another example, such noise in the EM radiation 101 may be generated by disperse media (e.g., mist, fog, smoke, or other obscurants) located in the environment between the imaging system 100 and the objects 103A, 103B, 103C. The polarization structure also provides higher contrast by detecting shape information, where the orientation of surfaces can be used to detect edges and correlate entire surfaces. The polarization structure also helps to eliminate all scattered radiation from the surface or the atmosphere between sensor and object, which lowers the noise in the system and only reads photons from the actual surface. The polarization structure also sees and detect small surface changes for enhanced vision and machine vision of object shapes as well as black surfaces which are very difficult for other ToF and Lidar systems.

In some implementations, the filtering function of the unit cell 304 may be achieved by the different polarizer pixels 306A, 306B, 306C, 306D having different metal wire orientations $\theta_1$, $\theta_2$, $\theta_3$, $\theta_4$. Although the angles $\theta_1$, $\theta_2$, $\theta_3$, $\theta_4$ can be of any value between 0 and 360 or multiples thereof, FIG. 3B shows four specific angles of orientation merely for the sake of illustration, namely 0-degrees (e.g., in polarizer pixel 306A), 45-degrees (e.g., in polarizer pixel 306B), 135-degrees (e.g., in polarizer pixel 306C), and 90-degrees (e.g., in polarizer pixel 306D).

In the example shown in FIG. 3B, the unit cell 304 of the polarization structure may include a $\theta_1$-degrees (e.g., 0 degrees) polarizer pixel 306A implemented using a grid of metal nanowires having a $\theta_1$-degree orientation, thereby only allowing the $\theta_1$-degree polarization state of the EM radiation 101 to pass through to be detected by the radiation-sensing pixels 302; other polarization states of the EM radiation 101 are rejected by the polarizer pixel 306A.

Similarly, the unit cell 304 of the polarization structure may include a $\theta_2$-degrees (e.g., 45 degrees) polarizer pixel 306B implemented using a grid of metal nanowires having a $\theta_2$-degree orientation, thereby only allowing the $\theta_2$-degree polarization state of the EM radiation 101 to pass through to be detected by the radiation-sensing pixels 302; other polarization states of the EM radiation 101 are rejected by the polarizer pixel 306B. A similar concept is applicable to the $\theta_3$-degrees (e.g., 135 degrees) polarizer pixel 306C and the $\theta_4$-degrees (e.g., 90 degrees) polarizer pixel 306D shown in FIG. 3B.

In some implementations, the metal nanowires used in the unit cell 304 of the polarization structure may be formed from aluminum, copper, tungsten, tin, chromium, indium, gold, a combination thereof, or the like. In some examples, the integrated image sensor 104 can be tuned to detect different wavelengths of the EM radiation 101 by changing the width W1 and pitch P of the metal nanowires, as long as the width W1 and the pitch P of the metal nanowires are less than the wavelength sought to be detected. In general, when this condition is met (i.e., the width W1 and the pitch P of the metal nanowires are less than the wavelength being detected), larger wavelengths can be detected by the integrated image sensor 104 by increasing the width W1 and pitch P of the metal nanowires, and smaller wavelengths can be detected by the integrated image sensor 104 by decreasing the width W1 and pitch P of the metal nanowires. For example, the integrated image sensor 104 can be tuned to detect EM radiation 101 in the visible spectrum by forming metal nanowires having widths W1 and pitches P in a range from about 50 nanometers to about 100 nanometers (e.g., about 70 nanometers wire with 70 nanometer spaces or many other combinations). As another example, the integrated image sensor 104 can be tuned to detect LWIR radiation by forming metal nanowires having widths W1 and pitches P in a range from about 200 nanometers to about 600 nanometers (e.g., in a range from about 400 nanometers to about 500 nanometers). For optimum performance of each polarizer element, the pixel cell of each image sensor 104 is formed with as much metal mass as possible to increase the electrical current or magnetic flux to better eliminate off axis photons. To do this, as described below in FIG. 5, trench isolation features around the pixels of the image sensor 104 are tied to the polarization grids to increase the current flow of each element. This is an electrical connection or conduction in the direction of the current flow.

While the example described above contemplates examples where the polarization structure includes metal nanowires having different orientations, any other type of polarization structure may be used. For example, polarization separation can occur at the radiation sensing layer of the image sensors 104 (e.g., the anode/cathode of a photodiode element, the unique sensing organics, depletion region, p+ region, n-type semiconductor material, etc.) or at the metal contact of the image sensors 104. FIGS. 11A to 11I show various examples where the polarization structure is added to the sensing layers or metal contacts of each pixel of the image sensor 104. As seen in FIGS. 11A to 11I, in some implementations, the polarization structure can be any polarizer element or subwavelength structure that can be incorporated into and be made part of the photodiode element of each pixel of the image sensors 104 (e.g., part of the anode or cathode materials or other structures of a photodiode element). The materials for such polarization structures can be any absorbing materials that make up an area in a wafer process. In some implementations, the polarization structure can include one or more material constructs exhibiting birefringence (and including plenoptic 3D), a structure including one or more meta-materials, antenna structures, aligned quantum dots, aligned carbon nanotubes, subwavelength structures other than meta-materials, and other structures. As an example, a polarization structure made up of aligned quantum dots can be constructed of such a dimension that quantum effects can be detected on the photons, thereby revealing the polarized state.

Figure 11A:
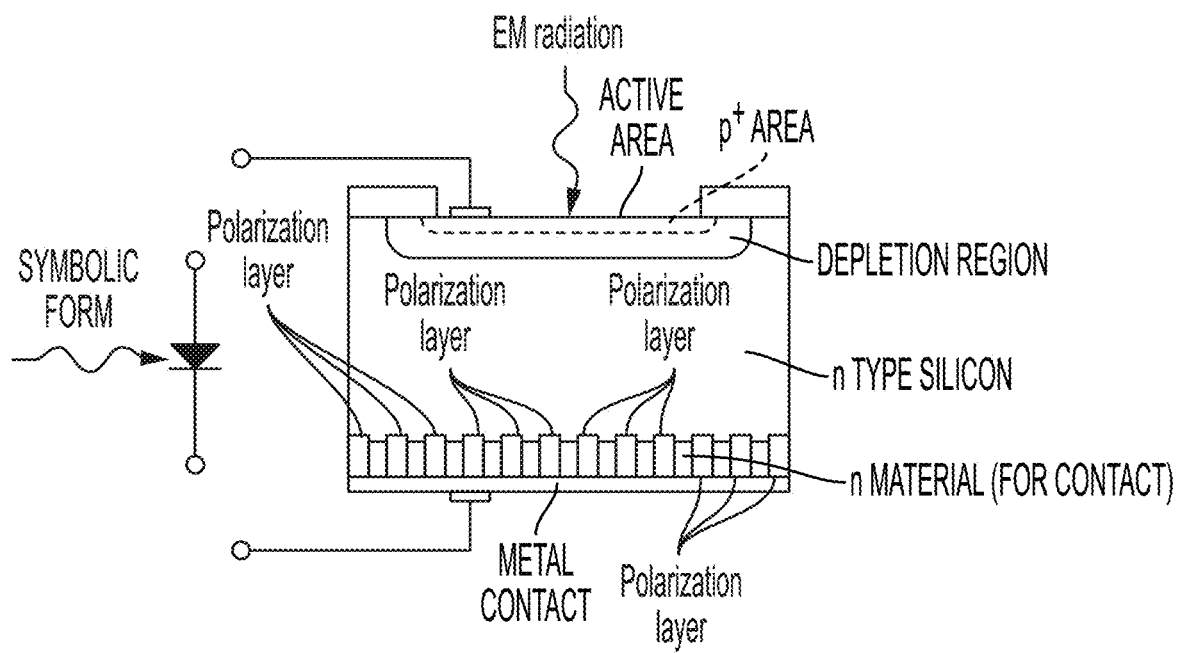
FIGS. 11A to 11I show various examples where the polarization structure is added to the sensing layers or metal contacts of each pixel of an image sensor.
Figure 11B:
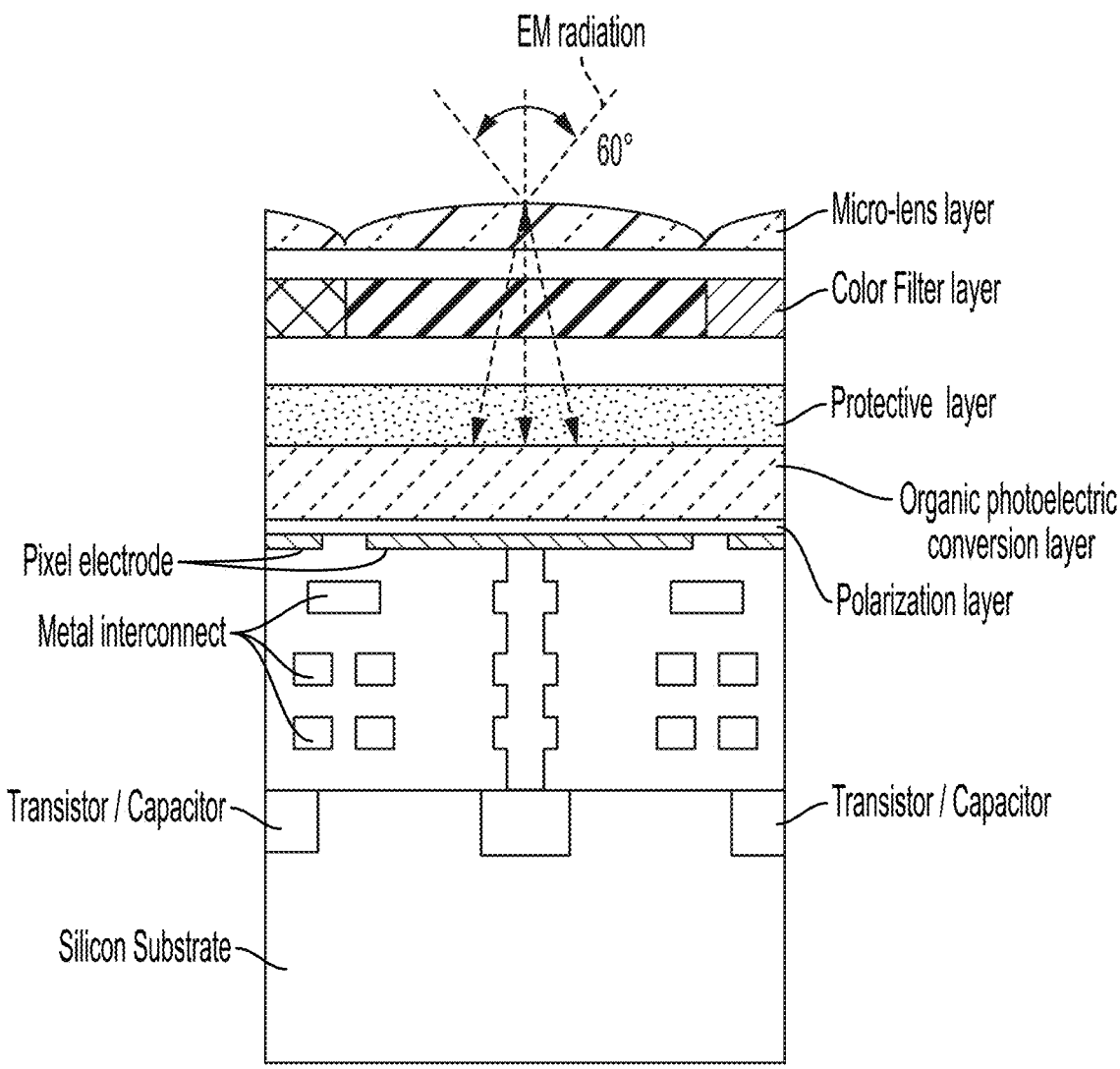
Figure 11C:
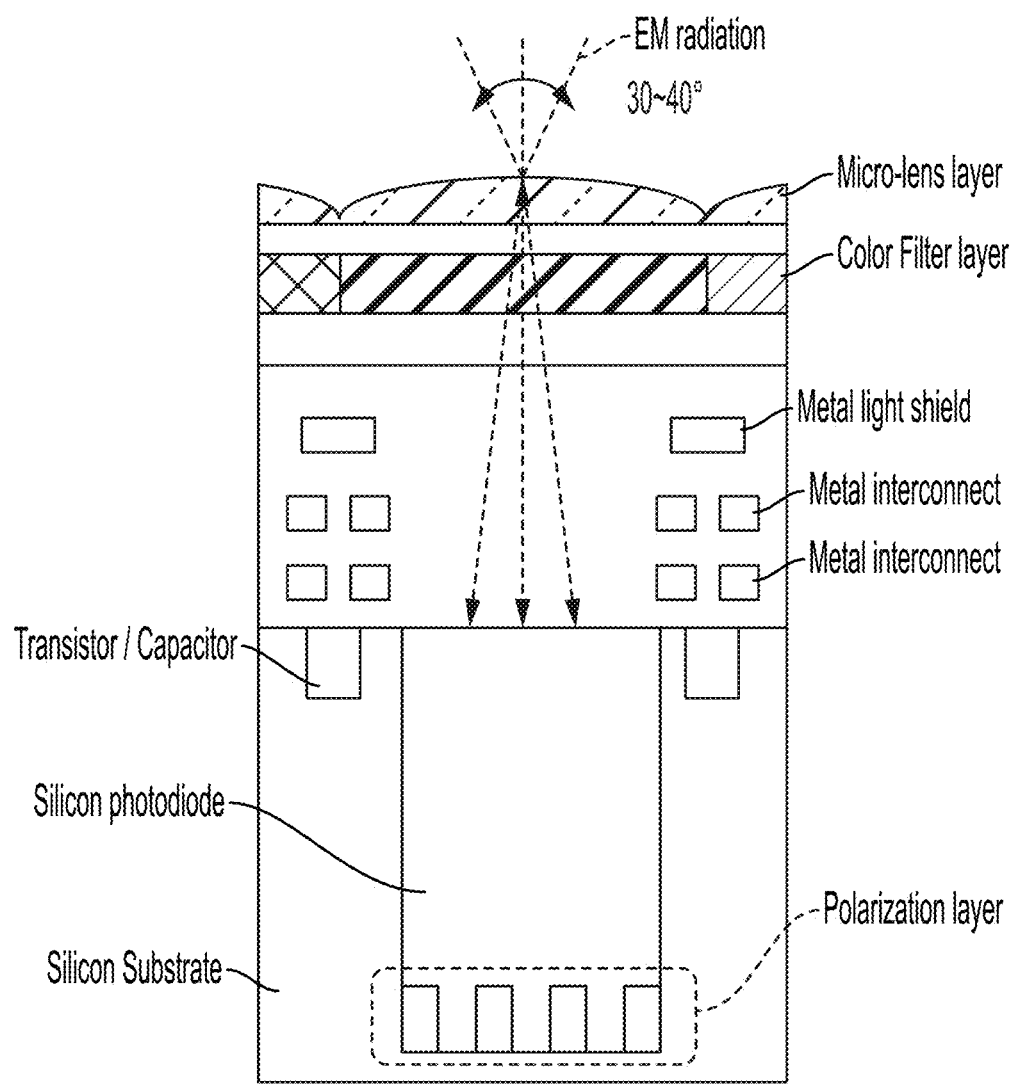
Figure 11E:
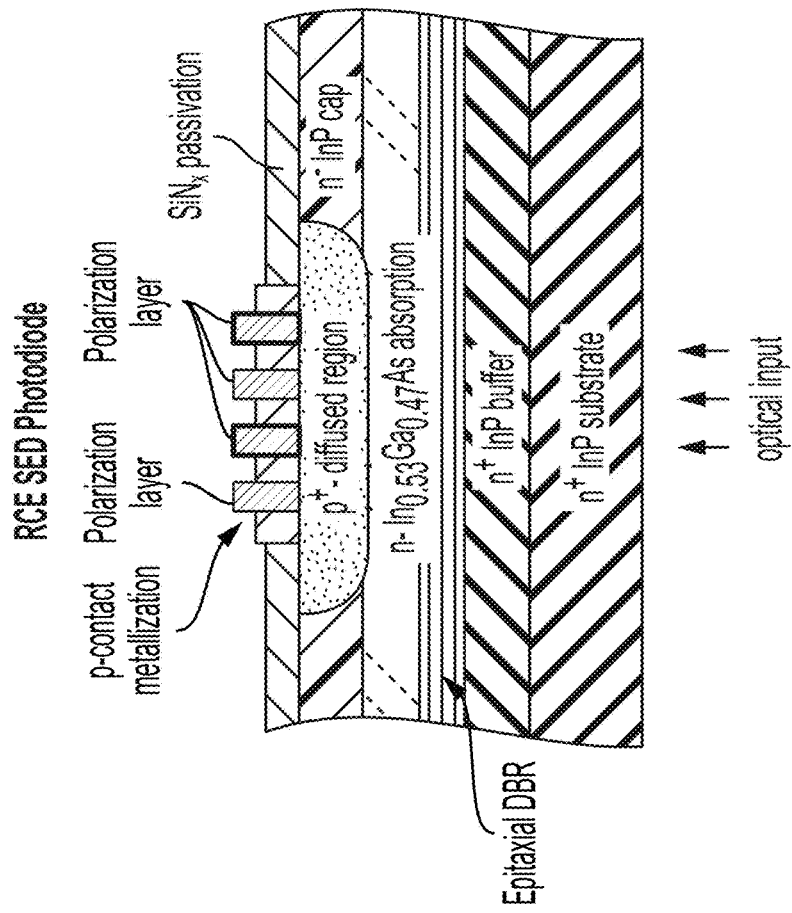
Figure 11D:
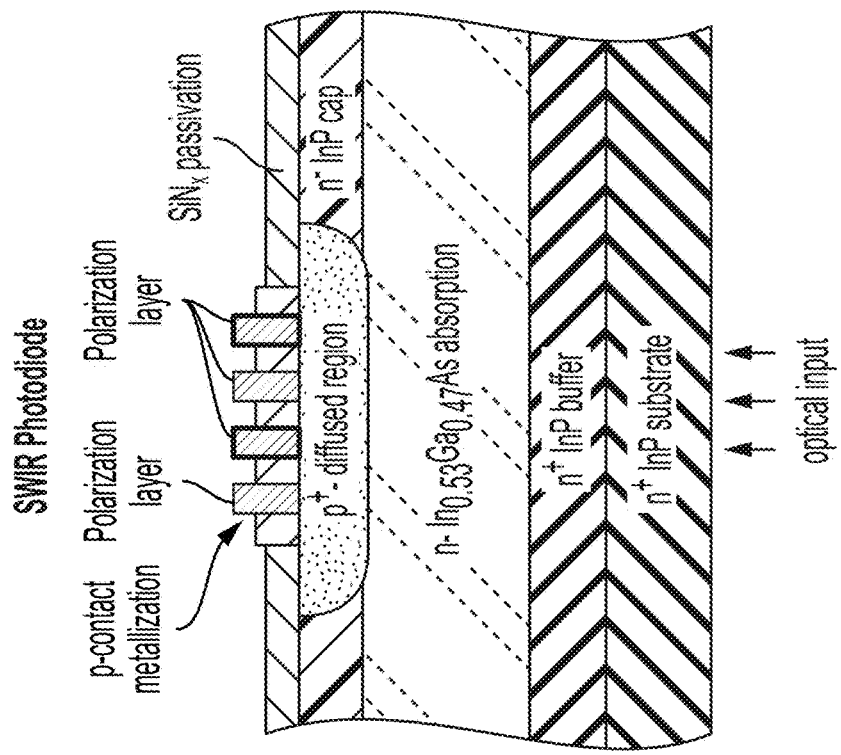
Figure 11G:
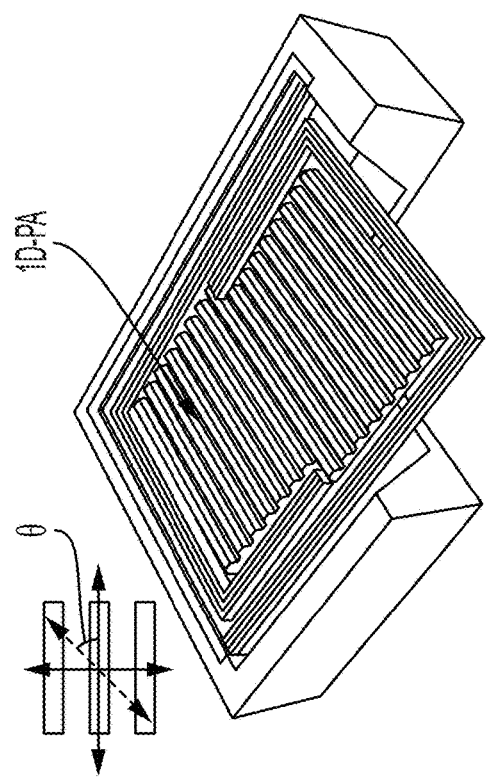
Figure 11G:
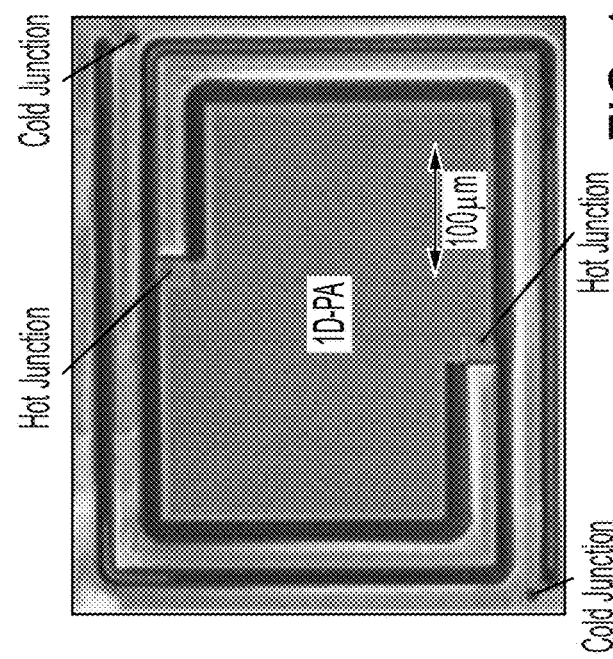
Figure 11F:
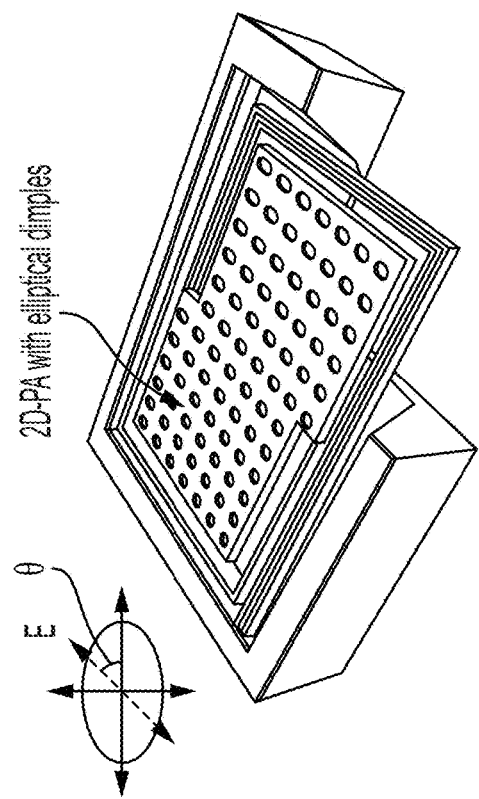
Figure 11F:
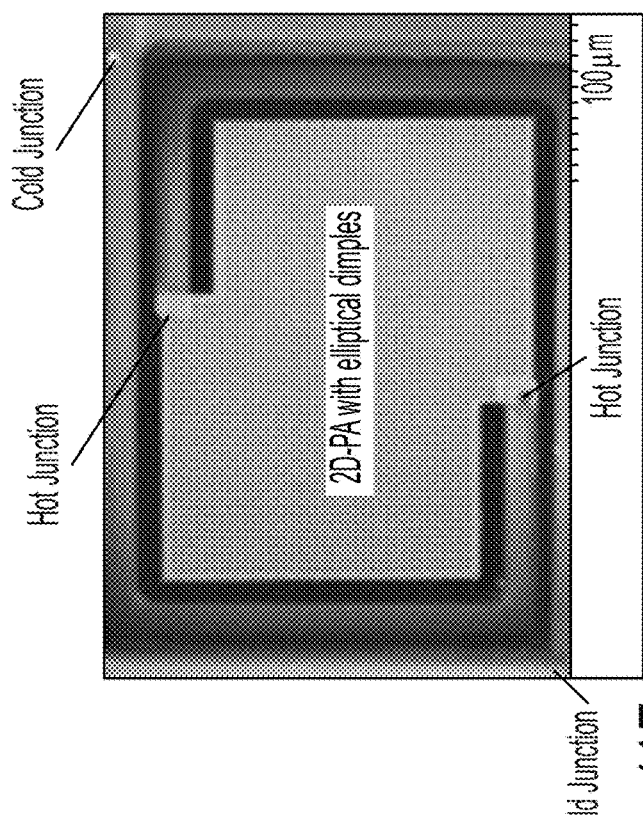
Figure 11I:
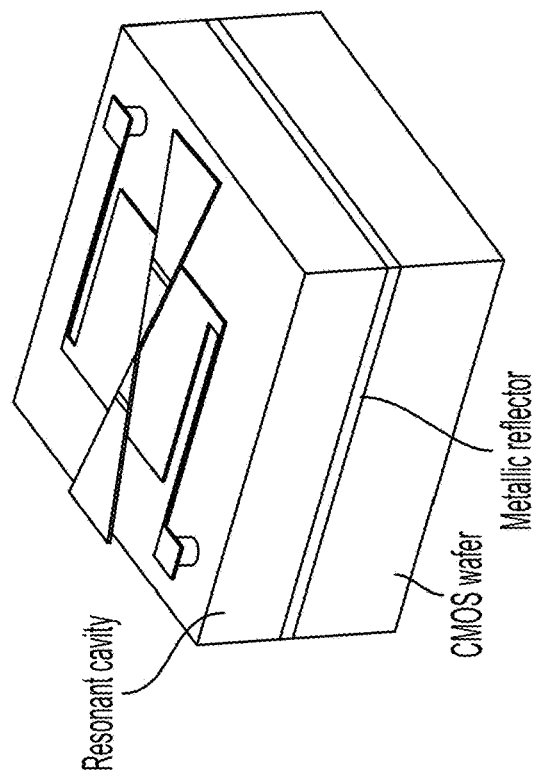
Figure 11H:
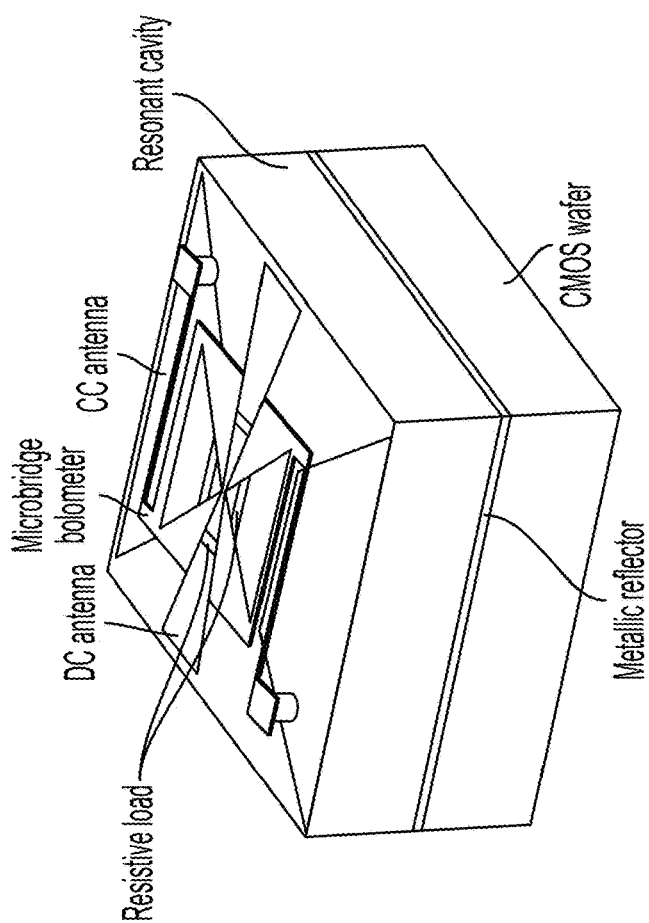

In FIG. 11A, the polarization structure is made a part of the n-type material for the metal contact of the photodiode element. In FIG. 11B, an organic photoelectric conversion layer acts as the sensing layer of the pixel, and the polarization structure is formed between the pixel's electrodes and the organic photoelectric conversion layer. In FIG. 11C, a silicon photodiode acts as the sensing layer of the pixel, and the polarization structure is formed at the anode/cathode layer of the silicon photodiode. In FIG. 11D, a SWIR photodiode has the polarization structure formed at the p-contact metallization. A similar feature is seen in FIG. 11E, which shows a resonant-cavity enhanced (RCE) having an epitaxial distributed Bragg reflector (DBR). FIG. 11F shows a subwavelength two-dimensional plasmonic absorber (2D-PA) with elliptical dimples, while FIG. 11G shows a subwavelength one-dimensional plasmonic absorber (1D-PA) that function as the polarization structure. These structures can be created on the sensing bridges of LWIR bolometers with many ways such as meta-materials, metal grids, birefringent layers, chemical bonds, formed birefringence, and any other subwavelength structures. The LWIR current materials are typically amorphous silicon or vanadium oxide and each can be polarization sensitive with the correct subwavelength structures. FIGS. 11H and 11I shows that the polarization structure can be formed by creating special sized antennas, such as infrared antennas, that work on silicon wafer structures or any other wafer materials. An effect of using polarization structures that are incorporated into the pixel (e.g., as in the examples of FIGS. 11A to 11I) is that the photodiode element itself is sensitive to polarization. This increases efficiency, increases SNR, and reduces cross-talk problems, thus allowing the polarization efficiency or extinction ratio of the polarizer elements to better approach theoretical performance. The measurement of the angle of the surface is angle information and is the same in all wavelengths and can be integrated across the surface of the imager or the object surface for more accuracy.

The unit cell 304 of the polarization structure is repeated over the entire array of radiation-sensing pixels 302 so that every radiation-sensing pixel 302 of the integrated image sensor 104 is associated with a respective polarizer pixel. In some implementations, such as in the example shown in FIG. 4A, the unit cell 304 of the polarization structure is repeated over the entire array of radiation-sensing pixels 302 so that a respective polarizer pixel 306 (e.g., having a grid of metal nanowires oriented in a particular direction) is disposed above only one radiation-sensing pixel 302. In such implementations, the boundaries of each polarizer pixel 306 coincides with the boundaries of a respective radiation-sensing pixel 302. Furthermore, in such implementations, each polarizer pixel 306 is of the same size as its respective radiation-sensing pixel 302.

Figure 4A:
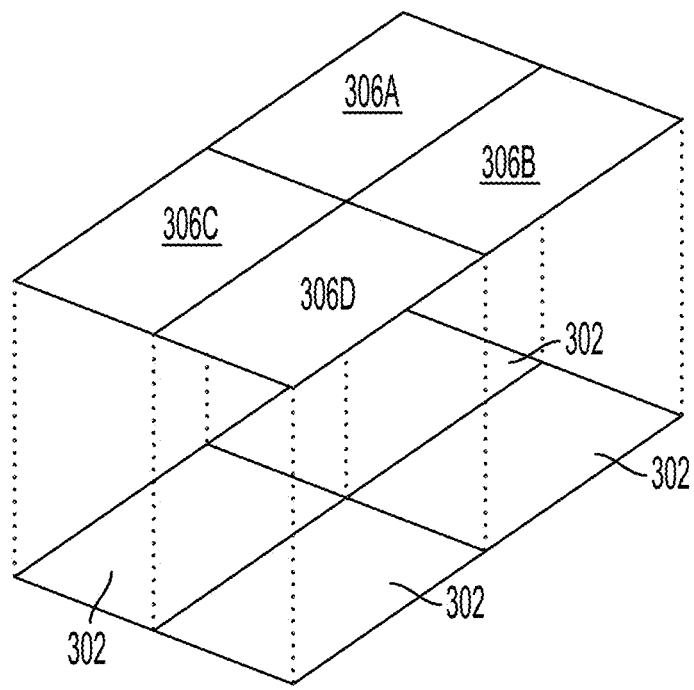
FIGS. 4A and 4B show examples of how the unit cell shown in FIG. 3B is repeated over the array of radiation-sensing pixels shown in FIG. 3A.
Figure 4B:
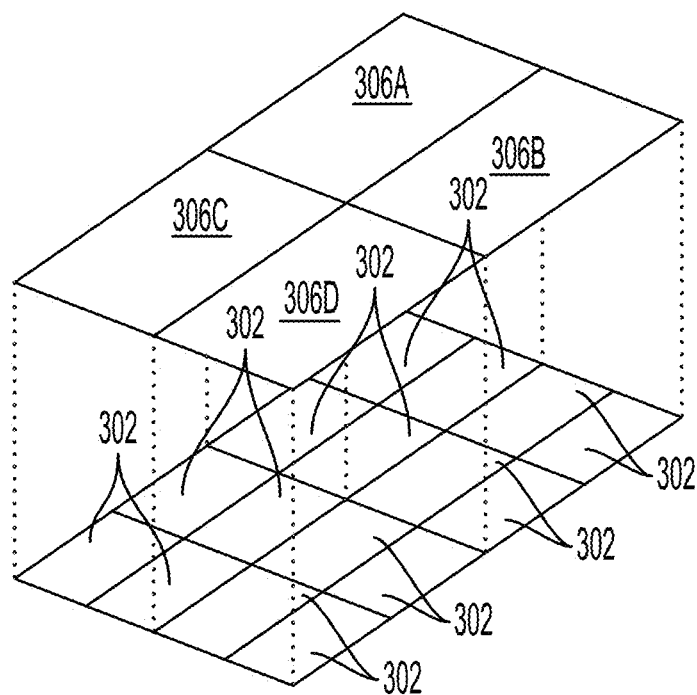

However, in other implementations, such as in the example shown in FIG. 4B, the unit cell 304 of the polarization structure is repeated over the entire array of radiation-sensing pixels 302 so that a respective polarizer pixel 306 (e.g., having a grid of metal nanowires oriented in a particular direction) is disposed above a collection of radiation-sensing pixels 302. In such implementations, the boundaries of each polarizer pixel 306 coincides with the boundaries of a sub-array of radiation-sensing pixels 302. Furthermore, in such implementations, each polarizer pixel 306 is of the same size as its respective sub-array of radiation-sensing pixels 302.

Figure 5:
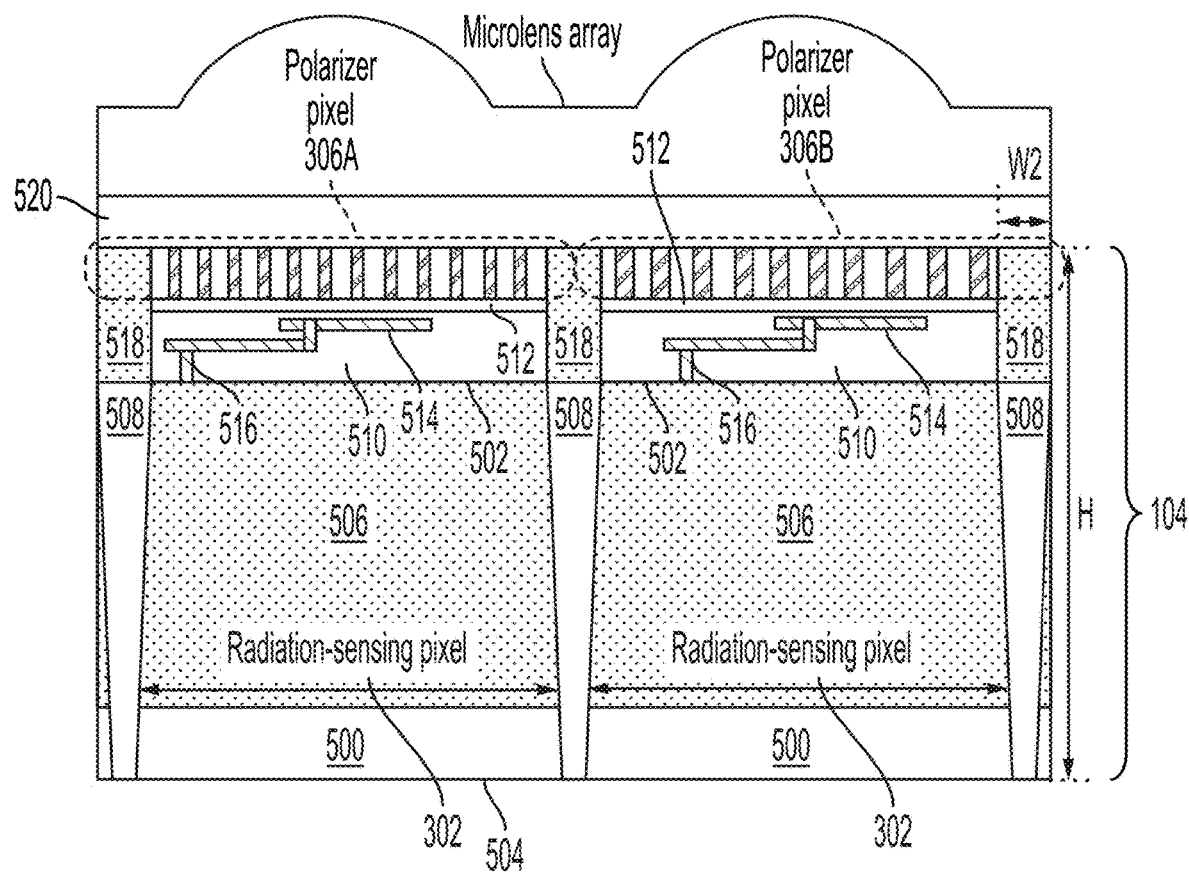
FIG. 5 shows an example cross-sectional view of a portion of an integrated image sensor of an imaging wafer.

FIG. 5 shows an example cross-sectional view of a portion of an integrated image sensor 104 of the imaging wafer 102. As an example, the cross-sectional view shown in FIG. 5 may be taken along the line A-A shown in FIG. 3B. In the example of FIG. 5, the integrated imaging sensor 104 includes the polarization structure formed over the array of radiation-sensing pixels 302. In the example shown in FIG. 5, the boundaries of each polarizer pixel (e.g., polarizer pixels 306A, 306B) coincides with the boundaries of a respective radiation-sensing pixel 302. For the sake of clarity, FIG. 5 also shows a portion of the respective microlens array 108 that is placed above the integrated image sensor 104 and that is part of the wafer-level integrated optics 106.

As seen in the example of FIG. 5, the integrated image sensor 104 includes a semiconductor substrate 500 that has a frontside 502 and a backside 504. In the example of FIG. 5, the frontside 502 of the semiconductor substrate 500 is designed to receive the incident EM radiation 101. Therefore, the integrated image sensor 104 shown in FIG. 5 may be referred to as a frontside illuminated image sensor. However, in other examples (e.g., shown and described in FIG. 10), the backside 504 of the semiconductor substrate 500 is designed to receive the incident EM radiation 101, and the integrated image sensor may, in those implementations, be referred to as a backside illuminated image sensor.

The semiconductor substrate 500 is made of a semiconductor material, such as silicon. In some implementations, the semiconductor substrate 500 may be a silicon substrate doped with P-type dopants such as boron, in which case the semiconductor substrate 500 is a P-type substrate. Alternatively, the semiconductor substrate 500 may be another suitable semiconductor material. For example, the semiconductor substrate 500 may be a silicon substrate that is doped with N-type dopants such as phosphorous, arsenic, or antimony, in which case the semiconductor substrate 500 is an N-type substrate. The semiconductor substrate 500 may include other elementary semiconductors such as germanium and diamond. The semiconductor substrate 500 may optionally include a compound semiconductor and/or an alloy semiconductor.

Furthermore, the semiconductor substrate 500 may include an epitaxial layer (epi layer), may be strained for performance enhancement, and may include a silicon-on-insulator (SOI) structure, and as described above in reference to FIGS. 11A to 11I, the photodiode itself can be sensitive to polarization orientation through these mechanisms.

The integrated image sensor 104 may have a radiation-sensing region 506 formed at the backside 504 of the semiconductor substrate 500. The radiation-sensing region 506 may be doped regions having first dopants formed in the semiconductor substrate 500 by a method such as diffusion or ion implantation on the semiconductor substrate 500. To be specific, the semiconductor substrate 500 is implanted with the first dopants from the backside 504 to form the radiation-sensing region 506. In some examples, the radiation-sensing region 506 may be formed by performing a plurality of ion implantation processes on the semiconductor substrate 500. The radiation-sensing region 506 is formed by multiple implantation processes using various dopants, implant dosages, and implant energies. The implantation processes may also use different masks that have different patterns and opening sizes. For example, N+implants, array-N-well implants, and deep-array-N-well implants may be performed. In some implementations, the ion implantation process implants the semiconductor substrate 500 with first dopants having an opposite doping polarity as the semiconductor substrate 500. For example, in some embodiments where the semiconductor substrate 500 is a P-type substrate, the radiation-sensing region 506 is doped with N-type dopants. In some embodiments where the semiconductor substrate 500 is an N-type substrate, the radiation-sensing region 506 is doped with P-type dopants.

In the example of FIG. 5, the radiation-sensing region 506 is formed adjacent to or near the backside 504 of the semiconductor substrate 500 to form a frontside illuminated image sensor. In other examples, depending on the design needs and manufacturing requirements, the radiation-sensing region 506 may be formed adjacent to or near the frontside 502 of the semiconductor substrate 500 (e.g., in a backside illuminated image sensor). The position or location of the radiation-sensing region 506 may also be adjusted by tuning an implantation energy level of the implantation process used to form the radiation-sensing region 506. For example, in some implementations, a higher implantation energy level results in a deeper implant, while a smaller implantation energy level results in a shallower implant.

In the example of FIG. 5, deep trench isolation features 508 are formed within the radiation-sensing region 506 to define the boundaries of the radiation-sensing pixels 302. Use of deep trenching in the design allows a photon to reflect within the pixel 302, thus increasing the likelihood that the photon is detected, thus acting in a sense as a photomultiplier. Stated differently, the deep trenching design of a single pixel allows two types of amplification to occur (which is useful for very low light situations). First, the deep trenching design "traps" the photon, thus increasing the signal reading in that pixel. Second, addition of the readings from the pixels focused on an object across multiple sensor sets in the array creates a multiplier effect for photon count and reading from the object. Various materials can amplify the charge of the photon by allowing them to bounce back into pixel area or be reflected or absorbed in sensing materials of the pixel walls. For example, the material used for the trench isolation features 508 may be similar to the material used for the polarization structure. For example, the trench isolation features 508 may be formed from aluminum, copper, tungsten, tin, chromium, indium, gold, a combination thereof, or any absorbing materials that make up an area in a wafer process (e.g., described above in FIGS. 11A to 11I).

As discussed above, the radiation-sensing pixels 302 are operable to sense or detect EM radiation 101 projected toward the radiation-sensing pixels 302 through the frontside 502 of the semiconductor substrate 500. In some implementations, the radiation-sensing pixels 302 include a photodiode. In other embodiments, the radiation-sensing pixels 302 may include other types of photodiodes, charge coupled devices (CCDs), longwave infrared (LWIR) detectors, X-ray detectors, photogates, reset transistors, source follower transistors, or transfer transistors, to name a few. Depending on the type of pixel elements used for the radiation-sensing pixels 302, the integrated image sensor 104 may be sensitive to colored EM radiation 101 (e.g., RGB color), monochrome EM radiation 101, or EM radiation 101 having other wavelength ranges such as visible light, NIR, SWIR, MWIR, LWIR, ultraviolet, microwaves, x-rays, gamma rays, radio frequencies, radiation in the terahertz range, etc. Stated differently, by selecting appropriate pixel elements for the radiation-sensing pixels 302, the integrated image sensor 104 may be sensitive to EM radiation 101 encompassing all wave energies in the spectrum of EM energy. Therefore, the integrated image sensor 104 may be configured to single or multiple wavelengths or wavebands (e.g., including various separations of specular and diffuse bands) to determine the various features of the objects 103A, 103B, 103C. This provides the advantage of upward and downward compatibility with any currently available imaging modality.

In some implementations, trenches are etched into the radiation-sensing region 506 (e.g., using a photolithography and etching process). In some implementations, such as in the example shown in FIG. 5, the trenches may extend from the frontside 502 of the semiconductor substrate 500 to the backside 504 of the semiconductor substrate 500. The trenches may have trapezoidal shapes having inclined sidewalls and a bottom edge, but the trenches may have approximately rectangular shapes, triangular shapes, or other suitable shapes in other examples. The trenches that are etched into the radiation-sensing region 506 are subsequently filled with a metal (e.g., using chemical vapor deposition (CVD), sputtering, plating, or other suitable processes) to form the trench isolation features 508.

As shown in the example of FIG. 5, each radiation-sensing pixel 302 includes an interconnect structure 510 and a buffer layer 512. In some implementations, the interconnect structure 510 is formed over the frontside 502 of the semiconductor substrate 500, and the buffer layer 512 is formed over the interconnect structure 510. The interconnection structure 510 includes a number of patterned dielectric layers and conductive layers that couple to various doped features, circuitry, and input/output of the respective radiation-sensing pixel 302. The interconnection structure 510 includes an interlayer dielectric (ILD) and a multilayer interconnection (MLI) structure. The material for the ILD of the interconnection structure 510 is chosen such the ILD is transparent to the wavelength of the EM radiation 101 that is detected by the radiation-sensing pixels 302. The MLI structure includes contacts, vias and metal lines. For illustration, a number of conductive lines 514 and vias/contacts 516 are shown in FIG. 5. However, the conductive lines 514 and vias/contacts 516 are exemplary. The actual positioning and configuration of the conductive lines 514 and vias/contacts 516 may vary depending on design needs and manufacturing concerns.

In some embodiments, the MLI structure may include conductive materials such as aluminum, aluminum/silicon/copper alloy, titanium, titanium nitride, tungsten, polysilicon, metal silicide, or combinations thereof, being referred to as aluminum interconnects. Other manufacturing techniques to form the aluminum interconnect may include photolithography processing and etching to pattern the conductive materials for vertical connection (via and contact) and horizontal connection (conductive line). Alternatively, copper multilayer interconnects may be used to form the metal patterns. The copper multilayer interconnects may include copper, copper alloy, titanium, titanium nitride, tantalum, tantalum nitride, tungsten, polysilicon, metal silicide, or combinations thereof. The copper multilayer interconnects may be formed by a technique including CVD, sputtering, plating, or other suitable processes.

The buffer layer 512 is formed on the interconnect structure 510. In some implementations, the buffer layer 512 may be a single layer structure or may include two or more sub-layers. In some implementations, the buffer layer 512 includes a dielectric material that is transparent to the wavelength of the EM radiation 101 that is detected by the radiation-sensing pixels 302. For example, in some implementations, the buffer layer 512 includes as poly(methyl methacrylate) (PMMA). In other examples, dielectric material may be silicon oxide, silicon nitride, or a combination thereof. The buffer layer 512 may be formed by CVD, physical vapor deposition (PVD), or other suitable techniques. The buffer layer 512 is planarized to form a smooth surface by a chemical-mechanical-polishing (CMP) process.

FIG. 5 shows that the integrated image sensor 104 includes the polarization structure (e.g., including polarizer pixels 306A, 306B) formed on the buffer layer 512. As discussed above, the polarization structure may be formed from aluminum, copper, tungsten, tin, chromium, indium, gold, a combination thereof, or any other conductive materials. The polarization structure includes metal barriers 518 that define the boundary of each polarizer pixel 306 of the polarization structure. In some implementations, such as in the example shown in FIG. 5, a respective metal barrier 518 is vertically aligned to and sits on top of a respective trench isolation feature 508. The metal barrier 518 and the trench isolation feature 508 collectively form a mass of metal that operates as an isolation structure that reduces interference and crosstalk from adjacent polarizer pixels 306 or crosstalk from adjacent radiation-sensing pixels 302. This, in turn, increases polarization contrast and improves the efficiency of the polarizer pixel 306 in filtering EM radiation 101 having specific polarization states. In some implementations, a collective height H of the metal barrier 518 and the trench isolation feature 508 on which it sits may be in a range from about 20 micrometers to about 50 micrometers (e.g., about 30 micrometers), while a width W2 of the thickest portion of collective structure formed by the metal barrier 518 and the trench isolation feature 508 may be in a range from about 1 micrometer to about 5 micrometers (e.g., about 2 micrometers). In some implementations, the aspect ratio (e.g., calculated as the ratio of height H to the width W2) of the collective structure formed by the metal barrier 518 and the trench isolation feature 508 may be in a range from about 10 to 15.

FIG. 5 shows that the integrated image sensor 104 includes a passivation layer 520 formed on the polarization structure (e.g., the polarizer pixels 306A, 306B). Material of the passivation layer 520 also fills the space between adjacent metal structures of the polarizer pixels 306A, 306B. In some implementations, the passivation layer 520 includes a dielectric material that is transparent to the wavelength of the EM radiation 101 that is detected by the radiation-sensing pixels 302. For example, the passivation layer 520 may include an oxide of silicon (e.g., silicon oxide or silicon dioxide). Alternatively or additionally, the passivation layer 520 may include silicon nitride. The passivation layer 520 may be formed by CVD, PVD, or other suitable techniques. The passivation layer 520 is planarized to form a smooth surface by a CMP process.

During operation of the imaging system 100, EM radiation 101 arriving at the imaging system 100 is focused by elements of the wafer-level integrated optics 106 (e.g., the microlenses of the microlens array 108) to respective integrated image sensors 104 of the imaging wafer 102. The materials of the passivation layer 520, the buffer layer 512, and the ILD of the interconnection structure 510 are chosen such that they are transparent to the wavelength of the EM radiation 101 that is detected by the radiation-sensing pixels 302. The focused EM radiation 101 then passes through the passivation layer 520 and is filtered by respective polarizer pixels 306 to let EM radiation 101 of a specific polarization state through to the underlying interconnection structure 510 and radiation-sensing pixel 302. The filtered EM radiation 101 subsequently passes through the buffer layer 512 and the ILD of the interconnection structure 510 to reach the radiation-sensing pixels 302. The radiation-sensing pixels 302 generate electrons in proportion to the filtered EM radiation 101 detected by the radiation-sensing pixels 302. Therefore, the intensity of the filtered EM radiation 101 at various polarization states is detected. The metal barriers 518 and the trench isolation features 508 that define the boundaries of the polarizer pixels 306 and the radiation-sensing pixels 302 operate as isolation structures that reduce interference and crosstalk from adjacent polarizer pixels 306 or crosstalk from adjacent radiation-sensing pixels 302, thus increasing polarization contrast and improving the efficiency of the polarizer pixel 306. Furthermore, the conductive lines 514 and vias/contacts 516, instead of contributing to noise in the filtered EM radiation 101, also function to increase the polarization contrast. Therefore, each radiation-sensing pixel 302 and its associated polarizer pixel 306 function in a manner that is similar to a photomultiplier tube.

In some examples, the integrated image sensor 104 includes readout circuitry that captures the intensities of the EM radiation 101 recorded by each of the radiation-sensitive pixels of the integrated image sensor 104. In some implementations, the readout circuitry performs analog pre-processing on the intensities recorded at the radiation-sensing pixel 302. For example, in the unit cell 304 of the polarization structure, the readout circuitry may perform addition and subtraction, at the analog level, of the intensities recorded at the various angles $\theta_1$, $\theta_2$, $\theta_3$, $\theta_4$ of polarization. As an example, suppose $i_{\theta 1}$ is the intensity detected at the radiation-sensing pixel 302 having the $\theta_1$-degree polarizer pixel 306A, $i_{\theta 2}$ is the intensity detected at the radiation-sensing pixel 302 having the $\theta_2$-degree polarizer pixel 306B, $i_{\theta 3}$ is the intensity detected at the radiation-sensing pixel 302 having the $\theta_3$-degree polarizer pixel 306C, and $i_{\theta 4}$ is the intensity detected at the radiation-sensing pixel 302 having the $\theta_4$-degree polarizer pixel 306D. In some implementations, the readout circuitry may perform the following additions and subtractions at the analog level to form intermediate normal images before converting the intensities to the digital domain: $(i_{\theta 1}+i_{\theta 4})$, $(i_{\theta 4}-i_{\theta 1})$, $(i_{\theta 2}-i_{\theta 3})$. An effect of performing such pixel-level analog pre-processing is the reduction (e.g., elimination) of quantization errors that occur from first converting the intensities into the digital domain and subsequently processing the digitized intensities at the digital level. Consequently, analog pre-processing improves signal-to-noise ratio and the performance of the imaging system 100 in a low-light environment. Specifically, quantization error can occur when a sampled analog signal is converted to an analog-to-digital (ADC) output sequence, resulting in high periodic quantization noise. This could be a problem for the imaging wafer 102 when capturing a scene with a low degree of polarization. In contrast, pixel-level analog-to-digital (A/D) conversion achieves higher SNR than chip or column level A/D conversion approaches. Furthermore, the readout circuitry can perform these computations while consuming very little power and thus substantial reduction in system power can be achieved by performing processing at the pixel level. Additionally, by distributing and parallelizing the processing, speed is reduced to the point where analog circuits operating in subthreshold can be used.

The analog pre-processed signals are subsequently provided by the readout circuitry to the processing wafer 110 (e.g., shown in FIGS. 1A and 1B) that may be attached to the backside of the imaging wafer 102. The processing wafer 110 includes an array of edge processors 112, with a respective edge processor 112 being dedicated to processing signals received from a respective integrated image sensor 104. The edge processors 112 can include artificial intelligence (AI) or deep learning processors. In some implementations, the processing wafer 110 may be omitted, and the edge processors 112 may be placed on the imaging wafer 102. For example, an edge processor 112 may be placed on the imaging wafer 102 between adjacent integrated image sensors 104. In such implementations, a respective edge processor 112 is still dedicated to processing signals received from a respective integrated image sensor 104. In some examples, the edge processors 112 act as localized processing for respective integrated image sensors 104 for fast efficient analytics. Such dedicated processing results in real time generation of data (e.g., first and second order primitives, as described below). Advanced 3D analytics and AI engines can also be programmed at the system level.

The edge processor 112 dedicated to a respective integrated image sensor 104 generates a data set that is a dense, high-resolution, accurate, and information-rich representation of a scene or an objects 103A, 103B, 103C located within the field-of-view of the integrated image sensor 104. The representation of the objects 103A, 103B, 103C may be a localization (e.g., 3D localization) of the objects 103. Additionally or alternatively, the representation of the objects 103A, 103B, 103C may be identification, characterization, or quantification of surfaces, shapes, or interrelationships among the shapes of the objects 103. As mentioned above, the edge processor 112 generates the data set in real time (e.g., in a range from one millisecond to about 5 seconds) through a plurality of image frames similar to a 3D shape video. Each individual frame has rich data features including but not limited to 3D shape at pixel or object level.

For example, supposing that in the examples shown in FIGS. 3A and 3B, i0 is the intensity detected (e.g., in number of counts) at the radiation-sensing pixel 302 having the 0-degree polarizer pixel 306A, i45 is the intensity detected at the radiation-sensing pixel 302 having the 45-degree polarizer pixel 306B, i90 is the intensity detected at the radiation-sensing pixel 302 having the 90-degree polarizer pixel 306D, i135 is the intensity detected at radiation-sensing pixel 302 having the 135-degree polarizer pixel 306C, and iRHC and iLHC are the intensities of right-handed circular polarization and left-handed circular polarization, respectively, then the edge processors 112 may define an intensity array I as follows:

$$I = \begin{pmatrix} i0 \\ i45 \\ i90 \\ i135 \\ iRHC \\ iLHC \end{pmatrix}$$

In the example shown above, it is assumed that the radiation-sensing pixels 302 also includes pixels that are sensitive to the intensities of right-handed circular polarization and left-handed circular polarization.

The edge processors 112 may subsequently determine a Stokes vector, which may be generated by the above-described analog preprocessing and expressed as follows:

$$S = \begin{pmatrix} s0 \\ s1 \\ s2 \\ s3 \end{pmatrix}$$

where s0 in the amount of unpolarized EM radiation 101 (e.g., preferential to a 0-degree polarization), s1 is the amount of EM radiation 101 preferential to a 90-degree polarization, s2 is the amount of EM radiation 101 preferential to a 45-degree polarization, and s3 is the amount of EM radiation 101 preferential to a right-handed circular polarization. The Stokes vector can be determined using the analog pre-processed signals provided to the edge processors 112 by the readout circuitry.

The edge processors 112 may define a diattenuation vector D as follows:

$$D = \begin{pmatrix} d0 \\ d45 \\ d90 \\ d135 \\ dRHC \\ dLHC \end{pmatrix}$$

where d0 is the diattenuation of the radiation-sensing pixel 302 having the 0-degree polarizer pixel, d45 is the diattenuation of the radiation-sensing pixel 302 having the 45-degree polarizer pixel, d90 is the diattenuation of the radiation-sensing pixel 302 having the 90-degree polarizer pixel, d135 is the diattenuation of the radiation-sensing pixel 302 having the 135-degree polarizer pixel, and dRHC and dLHC are the diattenuations of right-handed circular polarization and left-handed circular polarization, respectively.

In general, the diattenuation d for each of the radiation-sensing pixel 302 may be determined by the edge processors 112 as follows:

$$d = \frac{p - c}{p + c}$$

where p is the intensity of a parallel polarized state and c is an intensity of a cross-polarized state. The diattenuation d of each of the radiation-sensing pixel 302 may be a measure of an effectiveness of the polarizer, with a perfect polarizer having a diattenuation of 1.

The processors 112 may relate the Stokes vectors with the intensity vectors as follows.

$$2 * \begin{pmatrix} i0 \\ i45 \\ i90 \\ i135 \\ iRHC \\ iLHC \end{pmatrix} =$$

$$\begin{pmatrix} 1 & d0*\cos(2*(0+90)) & d0*(\sin(2*0)) & 0 \\ 1 & d45*\cos(2*(45+90)) & d45*\sin(2*45) & 0 \\ 1 & d90*\cos(2*(90+90)) & d90*\sin(2*90) & 0 \\ 1 & d135*\cos(2*(135+90)) & d135*\sin(2*135) & 0 \\ 1 & 0 & 0 & dRHC*\sin(2*(135-135)) \\ 1 & 0 & 0 & dRHC*\sin(2*(45+225)) \end{pmatrix} * \begin{pmatrix} s0 \\ s1 \\ s2 \\ s3 \end{pmatrix}$$

For the ideal case where all diattenuations d are equal to 1, the processors 112 may relate the Stokes vectors with the intensity vectors as follows:

$$2*\begin{pmatrix} i0 \\ i45 \\ i90 \\ i135 \\ iRHC \\ iLHC \end{pmatrix} = \begin{pmatrix} 1 & -1 & 0 & 0 \\ 1 & 0 & 1 & 0 \\ 1 & 1 & 0 & 0 \\ 1 & 0 & -1 & 0 \\ 1 & 0 & 0 & 1 \\ 1 & 0 & 0 & -1 \end{pmatrix} * \begin{pmatrix} s0 \\ s1 \\ s2 \\ s3 \end{pmatrix}$$

$$2*\begin{pmatrix} i0 \\ i45 \\ i90 \\ i135 \\ iRHC \\ iLHC \end{pmatrix} = \begin{pmatrix} 0.4 & -0.5 & -0.1 & 0 \\ 0.4 & 0 & 0.4 & 0 \\ 0.4 & 0.5 & -0.1 & 0 \\ 0.4 & 0 & -0.1 & 0 \\ 0.6 & 0 & 0.1 & 0.5 \\ 0.6 & 0 & 0.1 & -0.5 \end{pmatrix} * \begin{pmatrix} s0 \\ s1 \\ s2 \\ s3 \end{pmatrix}$$

$$2*\begin{pmatrix} s0 \\ s1 \\ s2 \\ s3 \end{pmatrix} =$$

$$\begin{pmatrix} \frac{1}{3} & \frac{1}{3} & \frac{1}{3} & \frac{1}{3} & \frac{1}{3} & \frac{1}{3} \\ -1 & 0 & 1 & 0 & 0 & 0 \\ 0 & 1 & 0 & -1 & 0 & 0 \\ 0 & 0 & 0 & 0 & 1 & -1 \end{pmatrix} * \begin{pmatrix} i0 \\ i45 \\ i90 \\ i135 \\ iRHC \\ iLHC \end{pmatrix} = \begin{pmatrix} 0.5 & 0 & 0.5 & 0.5 & 0.5 \\ -1 & 0 & 1 & 0 & 0 \\ -1 & 2 & -1 & 0 & 0 \\ 0 & 0 & 0 & 1 & -1 \end{pmatrix} * \begin{pmatrix} i0 \\ i45 \\ i90 \\ i135 \\ iRHC \\ iLHC \end{pmatrix}$$

$$2*\begin{pmatrix} s0 \\ s1 \\ s2 \end{pmatrix} = \begin{pmatrix} 1 & 0 & 1 & 0 \\ -1 & 0 & 1 & 0 \\ 0 & 1 & 0 & -1 \end{pmatrix} * \begin{pmatrix} i0 \\ i45 \\ i90 \\ i135 \end{pmatrix} = \begin{pmatrix} 1 & 0 & 1 \\ -1 & 0 & 1 \\ -1 & 2 & -1 \end{pmatrix} * \begin{pmatrix} i0 \\ i45 \\ i90 \end{pmatrix}$$

For a non-ideal case where at least one diattenuation d is less than 1, the edge processors 112 may relate the Stokes vectors with the intensity vectors as follows:

$$2*\begin{pmatrix} i0 \\ i45 \\ i90 \\ i135 \\ iRHC \\ iLHC \end{pmatrix} = \begin{pmatrix} 1 & -d0 & 0 & 0 \\ 1 & 0 & d45 & 0 \\ 1 & d90 & 0 & 0 \\ 1 & 0 & -d135 & 0 \\ 1 & 0 & 0 & dRHC \\ 1 & 0 & 0 & -dLHC \end{pmatrix} * \begin{pmatrix} s0 \\ s1 \\ s2 \\ s3 \end{pmatrix} =$$

$$\begin{pmatrix} d0 & \frac{1-d0}{2} & 0 & \frac{1-d0}{2} & 0 & 0 \\ \frac{1-d45}{2} & d45 & \frac{1-d45}{2} & 0 & 0 & 0 \\ 0 & \frac{1-d90}{2} & d90 & \frac{1-d90}{2} & 0 & 0 \\ \frac{1-d135}{2} & 0 & \frac{1-d135}{2} & d135 & 0 & 0 \\ 0 & 0 & 0 & 0 & \frac{1+dRHC}{2} & \frac{1-dRHC}{2} \\ 0 & 0 & 0 & 0 & \frac{1-dLHC}{2} & \frac{1+dLHC}{2} \end{pmatrix} *$$

$$\begin{pmatrix} 1 & -1 & 0 & 0 \\ 1 & 0 & 1 & 0 \\ 1 & 1 & 0 & 0 \\ 1 & 0 & -1 & 0 \\ 1 & 0 & 0 & 1 \\ 1 & 0 & 0 & -1 \end{pmatrix} * \begin{pmatrix} s0 \\ s1 \\ s2 \\ s3 \end{pmatrix}$$

Figure 6:
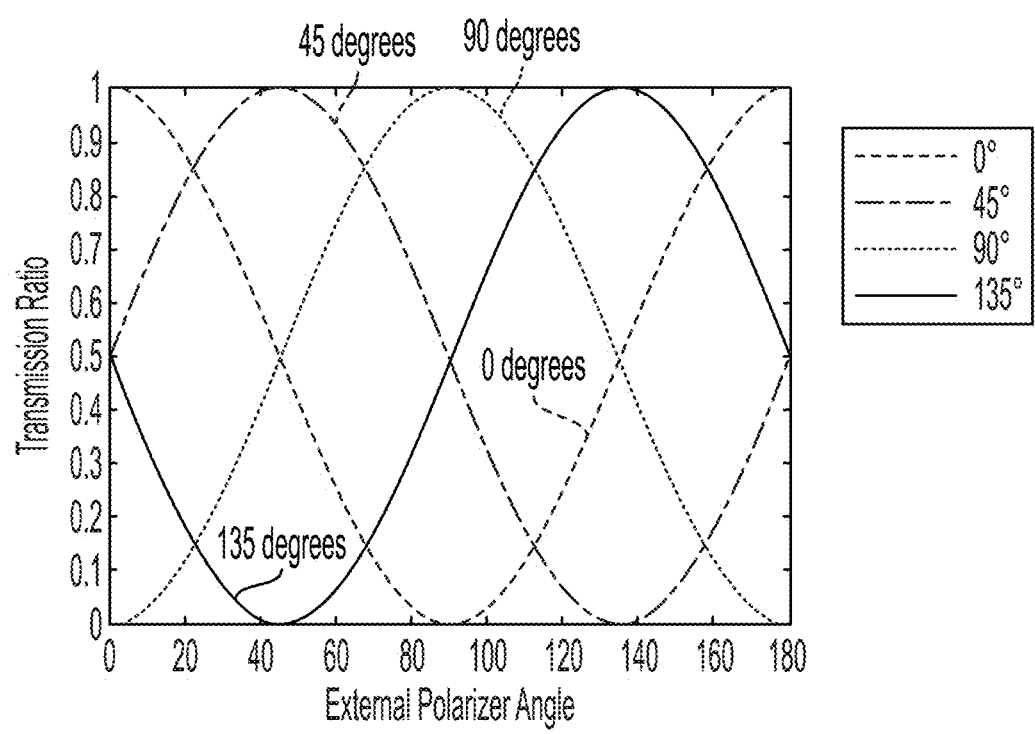
FIG. 6 shows an example plot of an ideal transmission ratio when electromagnetic radiation passes through two polarizers at different orientations.

The edge processors 112 may also be configured to determine a Mueller matrix calibration. For example, when EM radiation 101 passes through two polarizers at orientations $\theta_1$ and $\theta_2$, a theoretical transmission ratio is $\cos^2(\theta_1-\theta_2)$. For the example, for the polarization structure shown in FIGS. 3A and 3B (e.g., having the 0-degree, 45-degree, 90-degree, and 135-degree polarization filters), an ideal transmission ratio may be depicted in FIG. 6. In the example of FIG. 6, the maximum point on the curve is the parallel polarized state while the minimum point is the cross-polarized state. Many other properties can also be derived from this, such as the ratio of unpolarized to polarized, the elliptical form of the surfaces of the objects 103A, 103B, 103C, the index of refraction of materials of the objects 103A, 103B, 103C, whether the materials of the objects 103A, 103B, 103C are organic or materials, and an indication of the structure of the materials of the objects 103A, 103B, 103C, to name a few.

In practice, the intensities i (e.g., included in the intensity array I) have the following form $i=a+b*\cos^2(\theta_1-\theta_2+c)$. The above-mentioned Mueller matrix corrects for rotational errors (e.g. errors in the value c) and diattenuation errors (e.g., errors in the value a) that are induced by a non-ideal polarization structure. The corrected intensity array I' may be expressed as follows:

$$I' =$$

$$\begin{pmatrix} i0' \\ i45' \\ i90' \\ i135' \end{pmatrix} = \begin{pmatrix} 1 & -1 & 0 \\ 1 & 0 & 1 \\ 1 & 1 & 0 \\ 1 & 0 & -1 \end{pmatrix} * \begin{pmatrix} 1 & -d0 & 0 \\ 1 & 0 & d45 \\ 1 & d90 & 0 \\ 1 & 0 & -d135 \end{pmatrix}^{-1} * \begin{pmatrix} i0 \\ i45 \\ i90 \\ i135 \end{pmatrix} = \begin{pmatrix} 1 & -1 & 0 \\ 1 & 0 & 1 \\ 1 & 1 & 0 \\ 1 & 0 & -1 \end{pmatrix} *$$

$$\begin{pmatrix} 0.25 & 0.25 & 0.25 & 0.25 \\ -0.5 & 0 & 0.5 & 0 \\ 0 & 0.5 & 0 & -0.5 \end{pmatrix} * \begin{pmatrix} d0 & \frac{1-d0}{2} & 0 & \frac{1-d0}{2} \\ \frac{1-d45}{2} & d45 & \frac{1-d45}{2} & 0 \\ 0 & \frac{1-d90}{2} & d90 & \frac{1-d90}{2} \\ \frac{1-d135}{2} & 0 & \frac{1-d135}{2} & d135 \end{pmatrix}^{-1} *$$

$$\begin{pmatrix} i0 \\ i45 \\ i90 \\ i135 \end{pmatrix} = \begin{pmatrix} 0.75 & 0.25 & -0.25 & 0.25 \\ 0.25 & 0.75 & 0.25 & -0.25 \\ -0.25 & 0.25 & 0.75 & 0.25 \\ 0.25 & -0.25 & 0.25 & 0.75 \end{pmatrix} *$$

-continued $$\begin{pmatrix} d0 & \frac{1-d0}{2} & 0 & \frac{1-d0}{2} \\ \frac{1-d45}{2} & d45 & \frac{1-d45}{2} & 0 \\ 0 & \frac{1-d90}{2} & d90 & \frac{1-d90}{2} \\ \frac{1-d135}{2} & 0 & \frac{1-d135}{2} & d135 \end{pmatrix}^{-1} * \begin{pmatrix} i0 \\ i45 \\ i90 \\ i135 \end{pmatrix}$$

For the case of rotating polarizers or each radiation-sensing pixel 302 having different polarization rotations, a corrected diattenuation vector D' may be determined by the edge processors 112 as follows:

$$D' = \begin{pmatrix} d0' \\ d45' \\ d90' \\ d135' \end{pmatrix}, \text{ where } d' = \frac{(p_{max} - p_{min}) - (c_{max} - c_{min})}{(p_{max} - p_{min}) + (c_{max} - c_{min})}$$

where p is the intensity of a parallel polarized state, c is an intensity of a cross-polarized state, the subscript max indicating the brighter backlit intensity, and the subscript min indicating the dimmer backlit intensity.

As discussed above, the percentage of linear polarization in the EM radiation 101 when reflected from a surface of the objects 103A, 103B, 103C (e.g., indicated in FIG. 2A as a degree of linear polarization, DoLP) may be directly correlated to the direction cosine of the original EM energy incident on the objects 103A, 103B, 103C. Furthermore, the primary angle of the reflected linearly polarized light, which is indicated as Theta in FIG. 2A, may be mathematically related to the in-plane angle of the reflecting surface. The edge processors 112 may determine the degree of linear polarization DoLP and the angle of linear polarization Theta as follows:

$$\theta = 0.5 * \text{atan2}(s2, -s1)$$

$$DoLP = \frac{\sqrt{s1^2 + s2^2}}{s0}$$

The angle Theta may be in a range from $-\pi/2$ to $\pi/2$, with 0 radians indicating a linear polarization pointing up in image space (e.g. as seen in FIG. 2B). Consequently, the angle Theta encodes the in-plane angle of a normal to a surface of the objects 103A, 103B, 103C or portion thereof captured by the radiation-sensing pixel. The degree of linear polarization DoLP may be in a range from 0 to 1. The value 0 for the degree of linear polarization DoLP may indicate a completely unpolarized scene, while the value 1 for the degree of linear polarization DoLP may indicate a completely polarized scene. Consequently, the degree of linear polarization DoLP encodes the out-of-plane angle of a normal to a surface of the objects 103A, 103B, 103C or portion thereof captured by the radiation-sensing pixel.

In addition to the degree of linear polarization DoLP and angle Theta, several other measures of polarization may be determined by the edge processors 112. For example, the edge processors 112 may determine a degree of circular polarization (DoCP) and a total degree of polarization (DoP) as follows:

$$DoCP = \frac{s3}{s0}$$

$$DoP = \frac{\sqrt{s1^2 + s2^2 + s3^2}}{s0}$$

In general, the degree of circular polarization DoCP may be in a range from $-1$ (indicating a 100% left circular polarization) to $+1$ (indicating a 100% right circular polarization), with 0 indicating no circular polarization. The total degree of polarization DoP indicates the degree of both circular and linear polarization and may be in a range from 1 (representing a completely polarized scene) to 0 (representing a completely unpolarized scene).

Based on the above-described measures, the edge processors 112 may determine the surface normal vector for each for each radiation-sensing pixel as follows:

$$\begin{pmatrix} nx \\ ny \\ nz \end{pmatrix} = \begin{pmatrix} -\sin(\gamma) * \sin(\theta) \\ \sin(\gamma) * \cos(\theta) \\ \cos(\gamma) \end{pmatrix}$$

where nx, ny, nz are the x, y, and z coordinates of the surface normal vector, where $\gamma$ is the out-of-plane angle, and $\theta$ is the in-plane angle.

Figure 7:
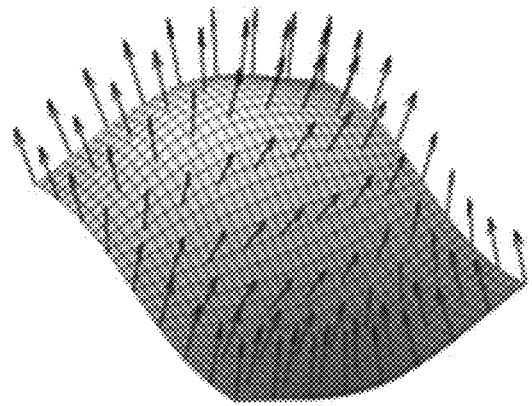
FIG. 7 shows an example three-dimensional distribution of surface normal vectors of an object.

Based on the discussion above, each of the edge processors 112 generates first-order primitives and second-order primitives based on the spatial phase data from the integrated image sensor 104. The first- and second-order primitives are a dense, high-resolution, accurate, and information-rich representation of the objects 103. Example first-order primitives include the above-described intensities i0, i45, i90, and i135, and the intensities of red, blue, and green light (e.g., in implementations where a color-sensitive radiation-sensing pixels are used in the integrated image sensor 104). Example second-order primitives include the above-described Stokes parameters s0, s1, s2, and s3; the diattenuation values d0, d45, d90, and d135; the angle of linear polarization (Theta); the degree of linear polarization DoLP; the out-of-plane angle $\gamma$ of the surface normal vector; the x, y, and z coordinates of the surface normal vector (e.g., nx, ny, nz described above); the ideal surface normals calculated for an ideal surface; the corrected surface normals; and the variables in the Mueller matrix. Other first- and second-order primitives include color information of objects; LWIR information of the objects; the depolarization factor, principal curvatures, mean curvature, Gaussian curvature, synthetic skin or lighting, unpolarized scatter, ellipticity, albedo, the index of refraction, material types, cluster of angles, surface angles, slope, rate of slope, surface scattering, specular/diffuse scattering, propagation scattering of the objects; pixel-to-pixel clusters; 3D object or scene detection; distance tracking; scene reconstruction; object mapping; surface characterization; and others. The first-order primitives and second-order primitives computed from the spatial phase data are indicative of various features of the objects 103, which may be represented by a broad number of parameters beyond just surface normal vectors, examples being a degree of linear polarization, geometry, a frequency distribution of the EM radiation 101 emanating from the objects 103, angles of various surfaces of the object, identification of material(s) of the object (e.g., dielectric constants), etc. In some implementations, the data from the first-order primitives and second-order primitives may be displayed on a graphical display system as a 3D reconstruction of the objects 103, although such a graphical representation is not necessary. As an example, the first-order primitives and second-order primitives includes surface normal vectors, that may be graphically represented as shown in the example of FIG. 7. Many of the primitives can be calculated in almost real time (near time) such that they are usable in applications such as autonomy, stress strain, etc.

In the example of FIG. 7, the 3D distribution of the surface normal vectors shows that additional insights into the relationships among the surfaces of the objects 103A, 103B, 103C may be gleaned for a given frame. Such relationship among these surface normal vectors may be invariant to orientation in the physical world and may allow for the tracking of the shape or motion of the objects 103A, 103B, 103C. Therefore, in some examples, the data included in the first-order primitives and second-order primitives may be further processed to identify a collection and clustering of similar and non-similar angle data. As an example, the edge processors 112 may determine a change in direction of the surface normal vectors across a surface, a rate of change in the direction of surface normal vectors across a surface of the objects 103A, 103B, 103C, and a pixel surface orientation (e.g., an indication of a 3D surface orientation determined by the coordinates of the surface normal vectors).

The first-order primitives and second-order primitive may be intelligently interpreted into a real-world meaningful shape (e.g., an identification of whether the objects 103A, 103B, 103C are a person, car, pipe, etc.). Such a shape may be digitally created by combining one or more of the pixel data. For example, the objects 103A, 103B, 103C may also be represented by a series of panels and shapes, with invariant slope and differencing between sections such as panels, slopes and change in slopes. The perspective of each surface panel and its relationship to neighboring surfaces therefore creates an invariant real-world object shape. Therefore, the edge processors 112 may be capable of direct surface detection and mapping in real world variables. The examples described above is merely one specific example of clustering. The proposed imaging system 100 enables the examination of the pixels in a single frame or across frames as clusters of primitives or attributes. Such clustering may be based on, for example, angle as referenced or change in velocity of normal, etc. Clustering at that level allows the imaging system to perform higher order shape recognition often called "segmentation". Therefore, segmentation can be based on clustering of different attributes from the integrated image sensor 104.

Further to the above, first- and second-order primitives can be analyzed such that angular geometry among shapes can be determined. For example, the first- and second-order primitives can be used for at least the following: to determine segmentation and surface features within segment; identification, characterization, quantification, replication and variation calculations based on the properties derived; slope vectors, velocity and acceleration of normals; full scene rendering; distance calculations; machine vision approaches. By clustering similar features from the pixels, the system can group the scene into different object types enabling segmentation of the scene into those different object types. The application of this segmentation is crucial for machine visioning applications. Data from various sensor types in a wafer array, including color camera sensors, sensors arranged for 3D stereo depth sensing, sensors measuring polarization of visible light, sensors measuring intensity and polarization in infrared, and sensors potentially measuring other electromagnetic, acoustic and other energy types, enable novel surface and shape analysis capabilities through a range data layers, directly captured by sensors or derived from data from one or more sensors. Each data layer enabled by the wafer array provides data to characterize and quantify different aspects of shapes and surfaces, and when analyzed together, enable increasing degrees of confidence in surface analysis results. For example, a surface anomaly may not be visible in a photographic image, but readily apparent in multiple data layers and still further validated in others.

An important use of these data layers is in the detection of edges, clusters, and blobs, along with segmentation of a scene for computer vision applications. The data layers contain a range of cues, including differences in surface orientations (2D or 3D), rates of change of surface normals across a surface, shading and shadow information, surface roughness information, and 3D shape information, which enable novel approaches to common computer vision tools.

As an example, when monochrome intensity is available as data: edges, occlusions, blobs, and masks can be determined by finding changes in total intensity; shape can be determined based on lighting cues; shape and surface anomalies can be detected based on light reflection; general surface roughness can be determined based on surface reflection; expected surface material can be determined based on image recognition; and lighting can be determined based on shading and shadow information.

As another example, when color (e.g., RGB) intensity is available as data: edges, occlusions, blobs, and masks can be determined by finding color changes; shape can be determined based on color and lighting cues; shape and surface anomalies can be determined based on color differences; general surface roughness can be determined based on changes in pixel color; expected surface material can be determined based on image recognition with color data; and lighting can be determined based on shading and shadow information along with color variation.

As another example, when LWIR data is available as data: edges, occlusions, blobs, and masks can be determined by finding thermal differences; shape can be determined based on thermal cues; shape and surface anomalies can be determined based on thermal differences; surface material can be determined based on thermal properties; and lighting and shadows can be determined based on thermal information.

As another example, when DoLP is available as data: edges, occlusions, blobs, and masks can be determined based on degrees of polarized reflections; shape can be determined based on surface normal direction (e.g., as seen in FIG. 7); shape and surface anomalies can be determined based on surface polarization and boundary changes; surface roughness can be determined based on changes in pixel-level surface polarization; surface material can be determined based on surface polarization information; and lighting can be determined based on surface polarization and orientation information.

As another example, when AoP is available as data: edges, occlusions, blobs, and masks are determined based on angles of polarized reflections; shape is determined based on surface normal direction; shape and surface anomalies are determined based on changes in surface orientation; surface roughness is determined based on pixel-level changes in surface orientation; surface material is determined based on information about surface orientations; and lighting is determined based on information about surface orientations.

As another example, when Nxyz is available as data: edges, occlusions, blobs, and masks are determined based on changes in surface normal direction; shape is determined based on surface normal direction; shape and surface anomalies are determined based on changes in surface orientation; surface roughness is determined based on pixel-level changes in surface normal orientation; surface material is determined based on information about surface normal orientations; and lighting is determined based on information about surface orientations.

As another example, when principal curvatures is available as data: edges, occlusions, blobs, and masks are verified based on the shape of the space around given points; shape is determined based on 3D curves around given points; shape and surface anomalies are verified based on clusters of high maximum and minimum curvature values indicating a likely surface change. Furthermore, principal curvature can be used to predict expected changes in shading and shadow due to surface shape.

As another example, when mean curvature is available as data: edges, occlusions, blobs, and masks are verified based on divergence of surface normals around given points; shape is determined based on divergence of 3D surface normals around a given point; shape and surface anomalies are verified based on a high curvature value indicating a likely surface change. Furthermore, mean curvature can be used to predict expected changes in shading and shadow due to surface shape.

As another example, when Gaussian curvature is available as data: edges, occlusions, blobs, and masks are verified based on predicting a shape at given points from the products of the points' principal curvatures; shape is determined based on the Gaussian curvature's description of a general 3D shape around a given point; shape and surface anomalies are verified based on an indication of clusters of different shapes at adjacent points, indicating a likely surface change; and surface roughness is verified through analysis of the variation of shapes at points in a cluster.

As another example, when synthetic skin or lighting is available as data: edges, occlusions, blobs, and masks are verified based on cast shadows; rendered shape is further analyzed using synthetic lighting data; shape and surface anomalies are identified and characterized by highlighting details; and real lighting conditions may be estimated by comparing against synthetic lighting.

As another example, when 3D model data is available as data: edges, occlusions, blobs, and masks are identified based on the 3D shape; shape is determined based on the 3D model; shape and surface anomalies are determined, characterized, measures, and localized based on the 3D model; surface roughness can be directly measured based on the 3D model, if it is captured within an appropriate range; 3D object recognition can provide information about what surface materials should be expected; and the 3D model allows lighting, shadow, and shading to be removed or changed.

In some implementations, the first- and second-order primitives may be used to enhance AI algorithms. For example, the first- and second-order primitives may be used to generate a light map of the objects 103A, 103B, 103C. AI algorithms may be trained on light maps and enhanced by allowing simple correction or adaptation of the lighting, by providing simple surface normals, surface angles, classical polarization images, color and spectral tied directly to shape, angle invariant clusters, slope vectors at the pixel, cluster and image level, shape information, etc.

In some examples, appropriate data from the first- and second-order primitives may be displayed by a display system. Any display system that displays 3D depth cues computed from the topographic analysis may be used, examples including a 2D screen, a 3D holographic display, 3D or 2D navigation display, an augmented reality (AR) display, a virtual reality (VR) display, or the like. A 3D image depicted on the display system provides understanding of the combined data set in a volumetric form and allows a human to envision the objects 103A, 103B, 103C with its full 3D surfaces. The first- and second-order primitives may be displayed in various forms through transformation and translation algorithms such as high-resolution point clouds, high resolution triangular mesh, high resolution square mesh, 3D solid models, etc. The above-described use of the display system is merely an example of displaying one aspect of the information-rich data included in the first- and second-order primitives.

In some examples, pixels may be spatially clustered and pixel-by-pixel orientation and slope vectors may be used to describe the shape and perspective of the surfaces (e.g., orientation of the object's facets) of the objects 103A, 103B, 103C to one or more AI neural networks that operate on, for example, 3D objects. Real-world object coordinates may be correlated with the shapes and perspective of the surfaces. The grouping and clustering of oriented pixels/polygons can represent the shape of the objects 103A, 103B, 103C in an automated fashion. As the objects 103A, 103B, 103C are identified by their shape, a dynamic real-world model of the actual objects 103A, 103B, 103C or a digitally driven model of the objects 103A, 103B, 103C may be created. The digitally driven model may be a mix between direct measuring and data driven modeling that predicts and analyzes the data to determine how it is interacting with its environment. For example, this digitally driven modeling can use mathematical techniques that include first principle calculations, algorithmic approximation routines and AI approaches to further discover and indicate strong correlations amongst the feature sets. The use of these techniques can be applied at the creation of the first- and second-order primitives referenced or on the higher order features. For example, AI can be used to recognize real world objects from shape and orientation of facets rather than or in addition to intensity variables. In some implementations, the shape of the objects 103 may be associated with one or more datasets. Example datasets include meta data (e.g., date, time, location of sensor, biometric data of who captured, all primitive data records for all surface pixels used to define the shape) or a characterization and quantification of the shape (e.g., volume, location in universal coordinates, timeslice of capture).

In some examples, the objects 103A, 103B, 103C may be moving. Consequently, in some examples, a time-series analysis of the combined data set over different instances of time may be performed, e.g., to generate dynamic surface analytics that are indicative of, for example, surface flow, velocity, acceleration, stress and strain on a surface, etc., of the objects 103A, 103B, 103C. Therefore, the proposed imaging system 100 enables the examination of the pixels in a single frame or across frames as clusters of primitives or attributes. As an example, dynamic surface deformations and physics engines may be used to analyze the change in surface motion. In other examples, shapes of the objects 103A, 103B, 103C are predicted, e.g., based on the analysis of variations of the objects 103A, 103B, 103C in a time-series. Some applications include predicting the rate of corrosion or blister growth and predicting motion of the objects 103A, 103B, 103C based on its movement in a tracking application. Other applications of the imaging system 100 include drone detection or object tracking, quality inspection and 3D scanning in an industrial environment, wound imaging and early skin cancer detection, 3D facial reconstruction and identification of an individual, autonomous navigation, to name a few.

The imaging system 100 may include a control wafer 114 adhered to a backside of the processing wafer 110. In some implementations, the processing wafer 110 includes an array of control processors 116, each of which is configured to perform integration and processing (e.g., correlation) of the first- and second-order primitives from a group of edge processors 112. The control processors 116 may also be configured to relay key information to their associated edge processors 112. Since each control processor 116 manages and processes data from a group of edge processors 112, the number of control processors 116 formed on the control wafer 114 is less than the number of edge processors 112 formed on the processing wafer 110.

FIG. 8 shows an example where the wafer array of the imaging system 100 is cut or diced into a variety of shapes and arranged in a variety of form factors depending upon the application and the desired coverage and precision. For example, FIG. 8 shows multiple tiles that are spatially arranged to have a 360-degree solid-state view or radar of an environment. In some implementations, each tile may be mounted on a gimbal or static. In the example shown in FIG. 8, the multiple tiles may be arranged to substantially form the faces of a 3D shape (e.g., a dodecahedron-shaped dome). In other implementations, the tiles may be arranged to substantially form the faces of other 2D or 3D shapes. Other examples include a linear array of tiles, a single tile that forms a smart phone lens, a single tile that is placed on a gun site, multiple tiles that form the surface "skin" of planes or other vehicles, etc.

Figure 9A:
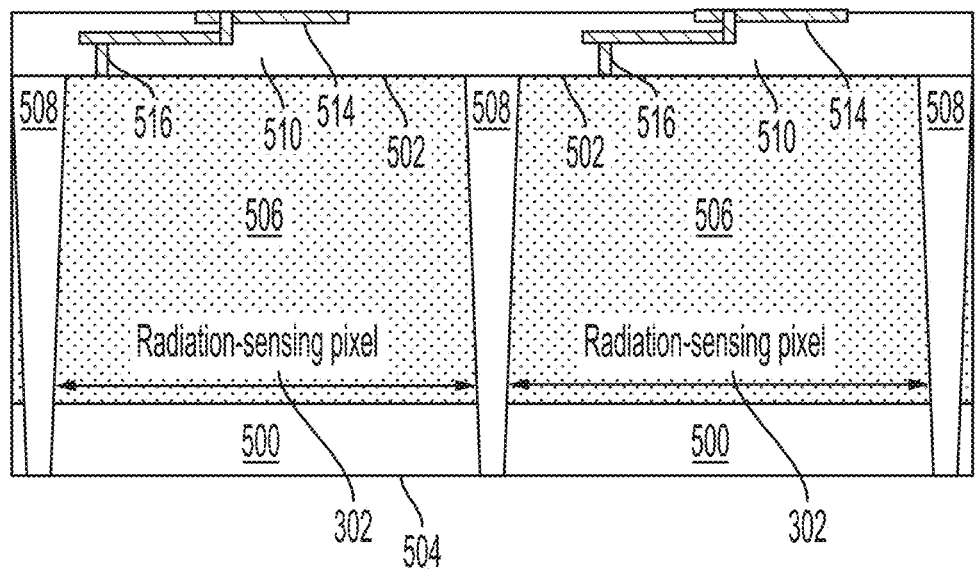
FIGS. 9A to 9J show an example manufacturing process that may be used to form the imaging system shown in FIGS. 1A and 1B.

FIGS. 9A to 9J show an example manufacturing process that may be used to form the imaging system 100 shown in FIGS. 1A, 1B, and 5. In FIG. 9A, the interconnect structure 510 is formed over the frontside 502 of the semiconductor substrate 500, which itself has the trench isolation features 508 formed within the radiation-sensing region 506 to define the boundaries of the radiation-sensing pixels 302 (e.g., using the processes discussed above in reference to FIG. 5).

Figure 9B:
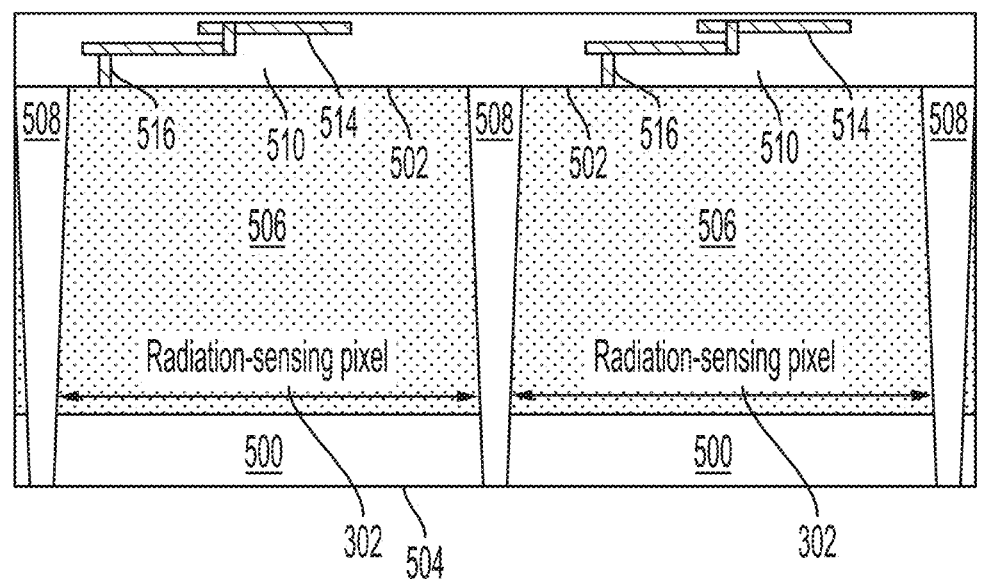

In FIG. 9B, a dielectric layer that is transparent to the wavelength of the EM radiation 101 that is detected by the radiation-sensing pixels 302 is formed on the interconnect structure 510. In some implementations, the dielectric layer may be an oxide of silicon (e.g., silicon dioxide) that covers exposed surfaces of the conductive lines 514 formed in the interconnect structure 510. The dielectric layer may be formed by CVD, PVD, or other suitable techniques. The dielectric layer is planarized to form a smooth surface by a CMP process.

Figure 9C:
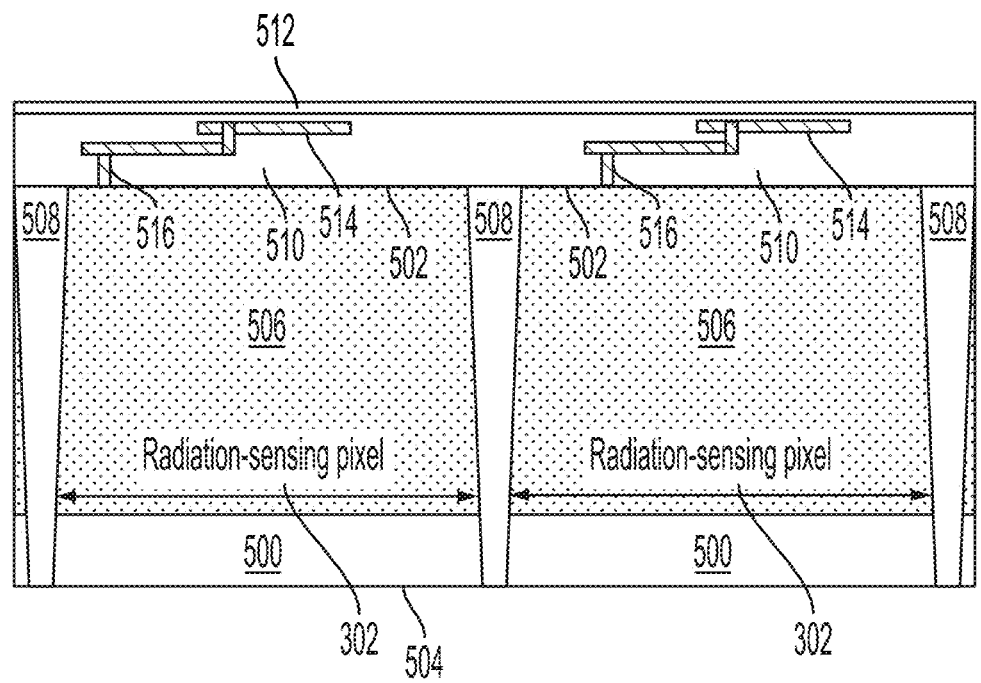

In FIG. 9C, the buffer layer 512 is formed on the dielectric layer formed in FIG. 9B. In some implementations, the buffer layer 512 may be a single layer structure or may include two or more sub-layers. In some implementations, the buffer layer 512 includes a dielectric material, such as poly(methyl methacrylate) (PMMA) or another material that is transparent to the wavelength of the EM radiation 101 that is detected by the radiation-sensing pixels 302. In other examples, the dielectric material may be silicon oxide, silicon nitride, or a combination thereof. The buffer layer 512 may be formed by CVD, PVD, or other suitable techniques. The buffer layer 512 is planarized to form a smooth surface by a CMP process.

Figure 9D:
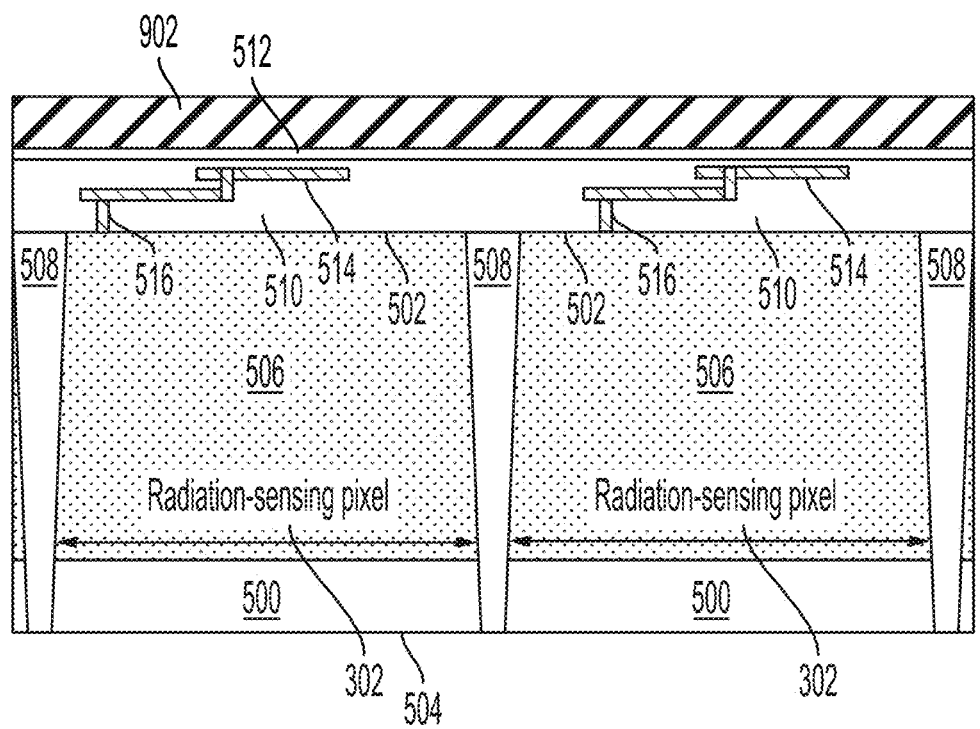

In FIG. 9D, a metal layer 902 is deposited on the buffer layer 512 (e.g., by CVD, sputtering, plating, or other suitable processes). In subsequent steps, the metal layer 902 is patterned to form the polarizer pixels 306. Therefore, the material of the metal layer coincides with the metal selected for the polarizer pixels 306.

Figure 9E:
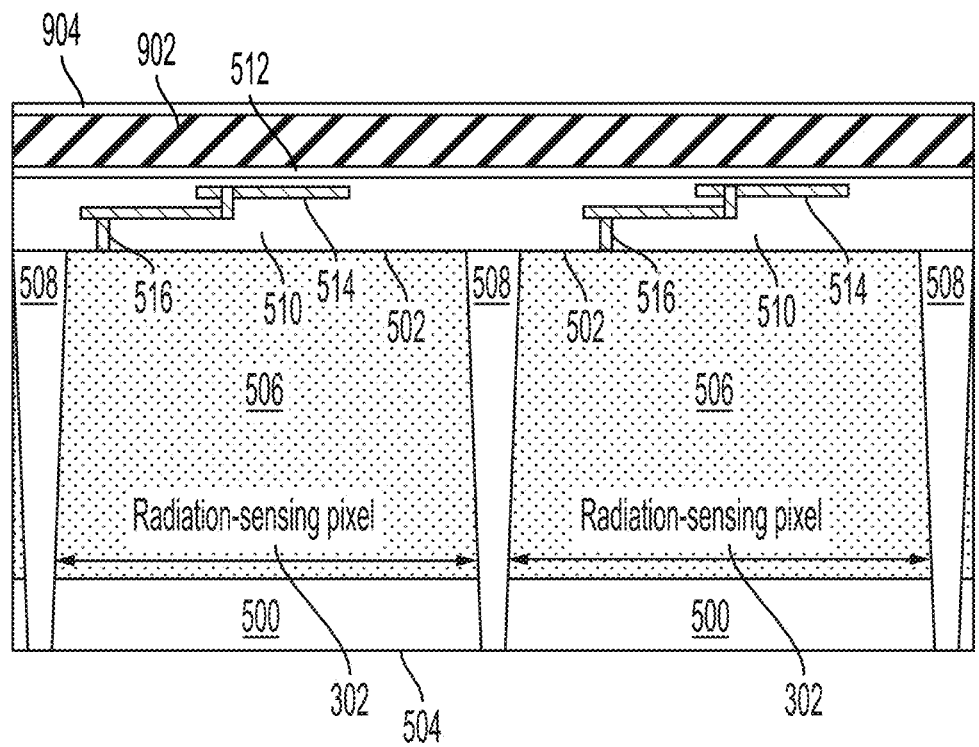
Figure 9F:
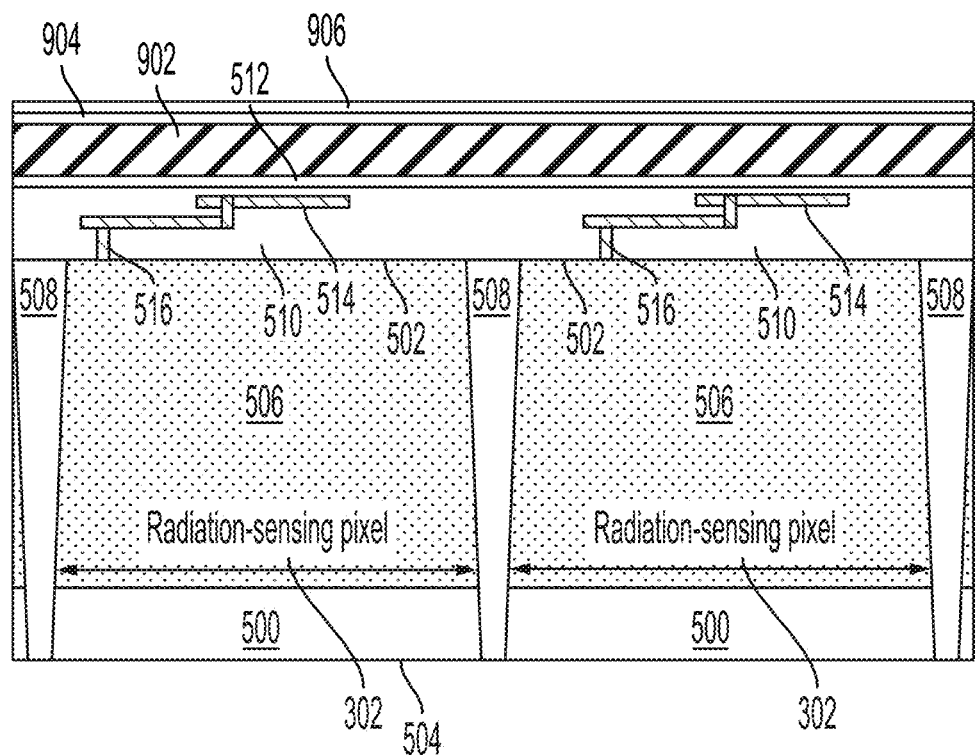

In FIG. 9E, a hard mask layer 904 (e.g., formed of silicon dioxide, silicon nitride, or a multi-layer combination thereof) is deposited on the metal layer 902 (e.g., by CVD, PVD, or other suitable techniques). In FIG. 9F, a photoresist (PR) layer 906 is formed (e.g., using a spin-on bake process) on the hard mask layer 904.

Figure 9G:
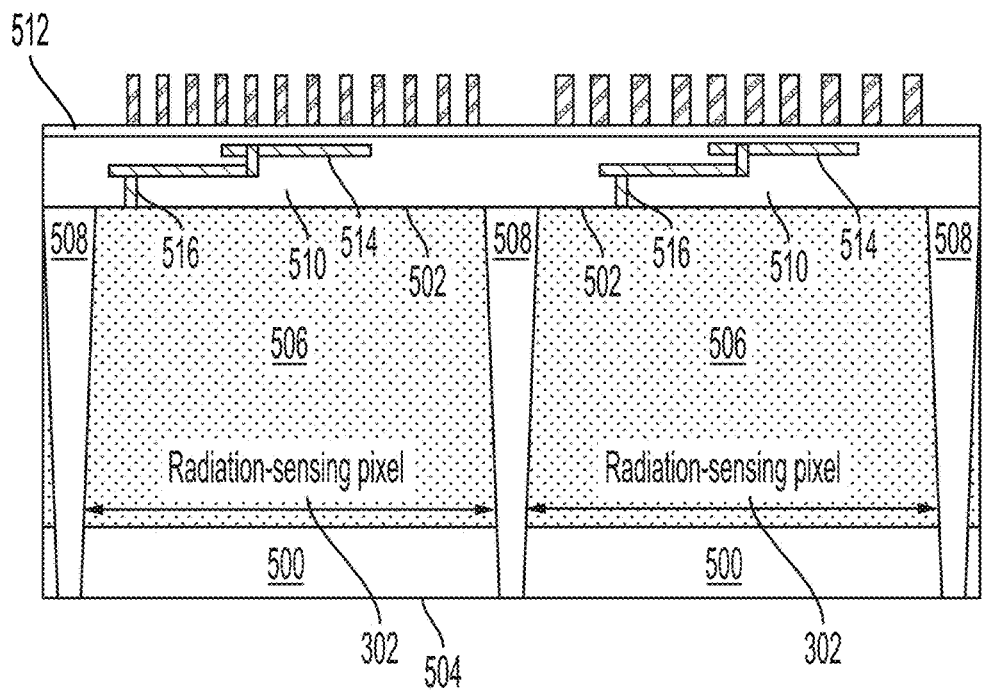

In FIG. 9G, a series of photolithography steps is performed to pattern the metal layer 902, thus forming the line and space patterns for the polarizer pixels (e.g., pixels 306A, 306B in the example shown in FIG. 9G). In FIG. 9G, the overlying hard mask layer 904 and PR layer 906 have been stripped away using a suitable process (e.g., an etching or ashing process).

Figure 9H:
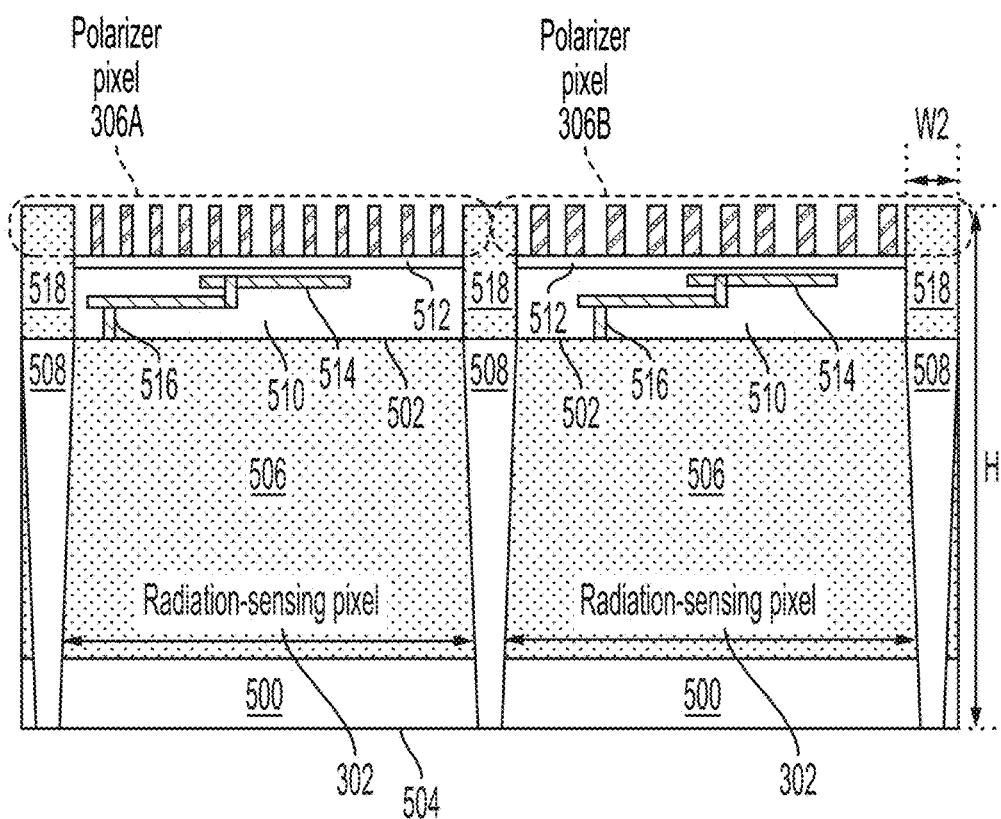

In FIG. 9H, a further series of photolithography steps is performed to form trenches in the buffer layer 512 and the ILD of the interconnect structure 510. These trenches are vertically aligned to and sit on top of respective trench isolation features 508. The trenches are subsequently filled with metal (e.g., using CVD, sputtering, plating, or other suitable processes) to form the metal barriers 518.

Figure 9I:
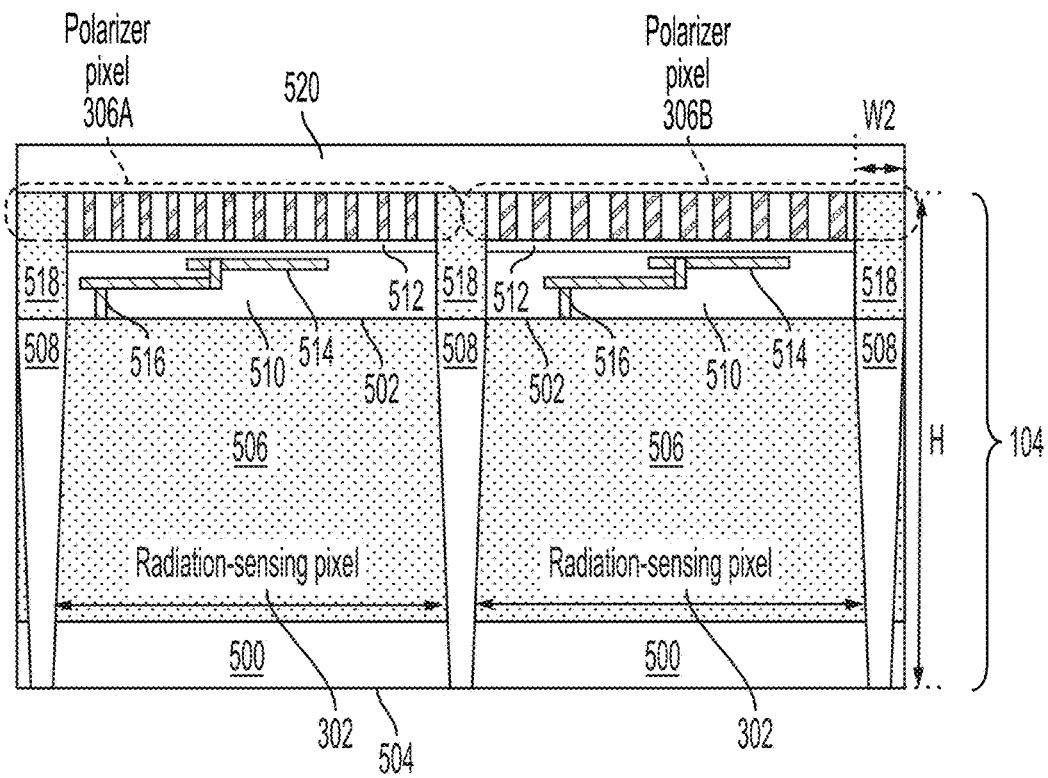
Figure 9J:
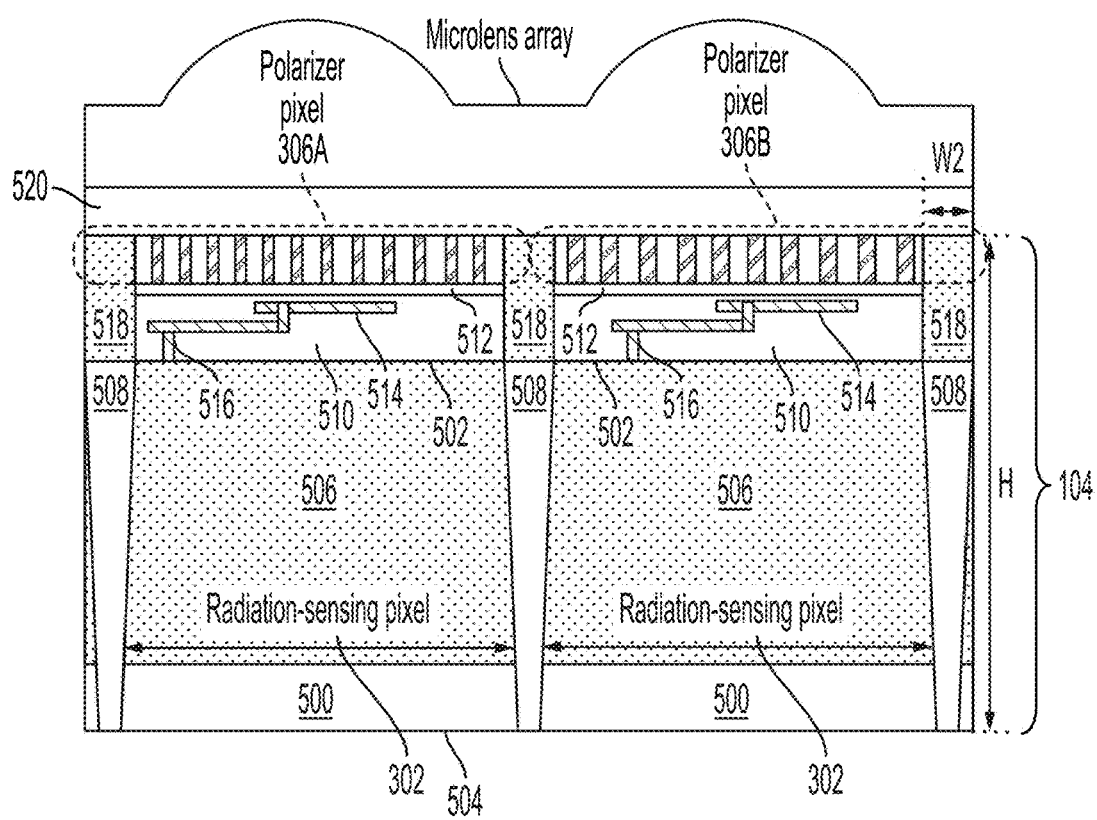

In FIG. 9I, the passivation layer 520 is formed over the metal barriers 518 and the line and space patterns. The passivation layer 520 also fills the space between adjacent line and space patterns. As discussed above, the materials of the passivation layer 520 is chosen such that it is transparent to the wavelength of the EM radiation 101 that is detected by the radiation-sensing pixels 302. The passivation layer 520 may act as a protective coating for the metal of the polarizer pixels 306. In FIG. 9J, the wafer-level integrated optics 106 (including the microlens arrays 108) are stacked on the imaging wafer 102.

Figure 10:
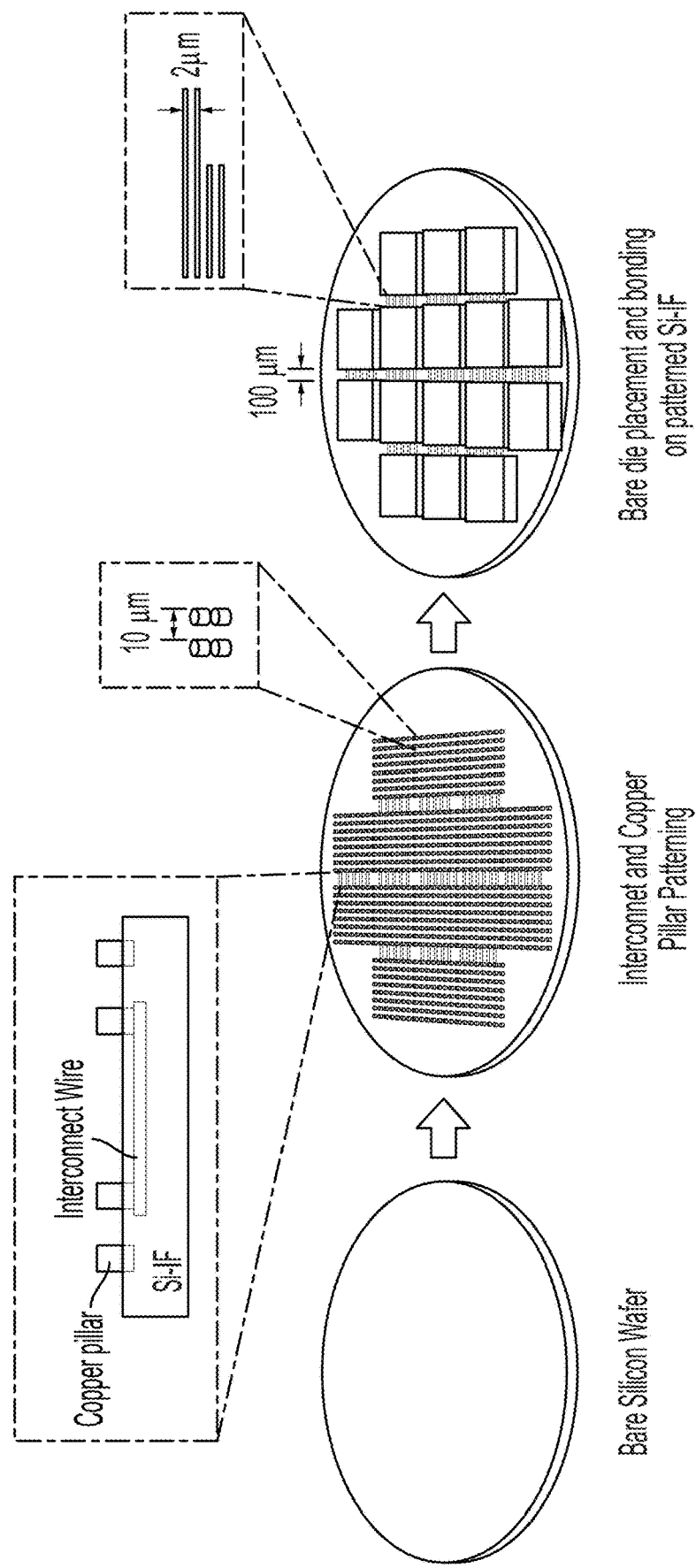
FIG. 10 shows an example wafer-based process flow for manufacturing a backside illuminated image sensor.

FIG. 10 shows an example wafer-based process flow for manufacturing a backside illuminated image sensor. In the example of FIG. 10, a processor is embedded at each imager level to control and perform most basic operations. In the backside approach shown in FIG. 10, the edge processors 112 are placed on a backside carrier wafer. The processors 112 are on the back side of the imager element 104 or on a separate wafer structure. Interconnect wafers with copper pillars and interconnect wires connect various layers of the wafers. An advantage is the use of the backside of the wafer, and other sensors (e.g., LWIR bolometers) can have the processor 112 built on the same wafer as the actual backside or bolometer bridge materials.

In summary, the proposed imaging system 100 is upward and downward compatible with any currently available imaging modality and can be developed out of full imaging wafers. For example, by stacking wafers, the proposed integrated imaging system can be manufactured as a small footprint package in a cost-effective manner. Illustratively, a first core level may be an imaging wafer having a plurality (e.g., thousands) of imaging sensors. The imaging sensors may be arranged as a collection of imagers, where each imager includes an SPI sensor and possibly one other sensor. The imaging wafer may be of any size (e.g., a 200 mm or 300 mm wafer) or may be a wafer used in any manufacturing node size. In some implementations, the imaging wafer may contain additional layers disposed on each of the imagers of the imaging sensors, examples of such additional layers being color, multispectral, hyperspectral, Infrared, polarization, lenslets, multiple types of other depth pixels or imagers, etc. An overlying wafer containing integrated wafer-level optics may be stacked or mounted over a top surface of the imaging wafer. The wafer-level optics may use standard lens designs for small elements for magnification. In some implementations, telescopic lenses may be included in the wafer-level optics. Onboard processors may also be provided in the small footprint package. For example, in some implementations, the onboard processors are placed on the imaging wafer between each of the imagers. However, the onboard processors may also be manufactured on a separate wafer (e.g., with multiple level processors) that can be attached to a back surface of the imaging wafer. In some implementations, a single controller processor processes and correlates the data from each imager for effective results image or results data. The local processors act as localized processing on the edge for fast efficient analytics. With shape-based processing (e.g., through the use of the SPI sensor), this architecture provides real-time results on the edge. Furthermore, advanced 3D analytics and AI engines can be programmed at the system level.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array), AI processor or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. Data processing may be performed by any and all processing types such as quantum processors, light field, etc. not just conventional computer chips of today. Computer storage medium includes any and all storage approaches be they SSD, optical, quantum based, photonic, biological, etc.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

In a general aspect, spatial phase integrated wafer-level imaging is described.

Example 1: An integrated imaging system, including an integrated image sensor and an edge processor. The integrated image sensor includes: a polarizer pixel configured to filter electromagnetic (EM) radiation and to allow filtered EM radiation having a selected polarization state to pass therethrough; a radiation-sensing pixel configured to detect the filtered EM radiation and to generate a signal in response to detecting the filtered EM radiation; and readout circuitry configured to perform analog preprocessing on the signal generated by the radiation-sensing pixel. The edge processor is configured to: generate first-order primitives and second-order primitives based on the analog preprocessed signal from the readout circuitry; and determine a plurality of features of an object located in a field-of-view of the radiation-sensing pixel based on the first-order primitives and the second-order primitives.

Example 2: The integrated imaging system of Example 1, wherein the polarizer pixel is vertically aligned and is disposed over the radiation-sensing pixel, and boundaries of the polarizer pixel coincide with boundaries of the radiation-sensing pixel.

Example 3: The integrated imaging system of Example 2, wherein the boundaries of the polarizer pixel are defined by metal barriers, and the boundaries of the polarizer pixel are defined by metal trench isolation features.

Example 4: The integrated imaging system of Example 3, wherein a material of the metal barriers and the metal trench isolation features includes aluminum, copper, tungsten, tin, chromium, indium, gold, or a combination thereof.

Example 5: The integrated imaging system of Example 3, wherein the radiation-sensing pixel is formed in a semiconductor substrate, and the metal trench isolation features extend from a frontside of the semiconductor substrate to a backside of the semiconductor substrate.

Example 6: The integrated imaging system of Example 1, further including a backside illuminated sensor including the radiation-sensing pixel.

Example 7: The integrated imaging system of Example 1, further including a frontside illuminated sensor including the radiation-sensing pixel.

Example 8: The integrated imaging system of Example 1, wherein the polarizer pixel is integrated into the radiation-sensing pixel.

Example 9: The integrated imaging system of Example 8, wherein the polarizer pixel is disposed at an anode level or a cathode level of the radiation-sensing pixel.

Example 10: The integrated imaging system of Example 1, wherein the polarizer pixel includes one or more material constructs exhibiting birefringence and including plenoptic 3D, a structure including one or more meta-materials, antenna structures, aligned quantum dots, aligned carbon nanotubes, subwavelength structures other than meta-materials, or a combination thereof.

Example 11: The integrated imaging system of Example 1, wherein the polarizer pixel includes a grid of metal wires having a selected orientation, and a line width and pitch of the grid of metal wires is less than a wavelength of the filtered EM radiation.

Example 12: The integrated imaging system of Example 1, wherein the polarizer pixel is configured to be sensitive to the wavelength of the filtered EM radiation based on the line width and the pitch of the grid of metal wires.

Example 13: The integrated imaging system of Example 12, wherein a material of the grid of metal wires includes aluminum, copper, tungsten, tin, chromium, indium, gold, or a combination thereof.

Example 14: The integrated imaging system of Example 1, wherein the radiation-sensing pixel includes an electromagnetic detector configured to be sensitive to EM wavelengths in a visible light range, a near infrared range, a short-wave infrared range, a mid-wave infrared range, a long-wave infrared range, an ultraviolet range, a microwave range, an X-ray range, a Gamma ray range, a radio-frequency range, or a terahertz range.

Example 15: The integrated imaging system of Example 1, wherein the plurality of features includes a full rendering of the object and a scene; a distance of the object from the integrated imaging system, machine vision analysis of the object and the scene; a three-dimensional model or image of the object, a frequency distribution of electromagnetic radiation emanating from the object, angles of one or more surfaces or shapes of the object, surface normal vectors associated with the one or more surfaces of the object, velocity and acceleration of the surface normal vectors, an identification of a material of the object, interior volume features of the object, gradients of the object, segmentation of the object, surface features within segments of the object, or a combination thereof.

Example 16: The integrated imaging system of Example 1, wherein the edge processor is further configured to identify, characterize, quantify, replicate, or determine a variation of the features determined by the edge processor.

Example 17: The integrated imaging system of Example 1, wherein at least one of the first-order primitives or the second-order primitives includes at least one of an orientation of EM radiation emitted by, reflected off, or transmitted through the object, a degree of linear polarization of the EM radiation, an amount of unpolarized scatter of the EM radiation, a primary angle of reflected linearly polarized EM radiation, an ellipticity of the EM radiation, albedo, an index of refraction of a material of the object, an angle of linear polarization, a degree of linear polarization, or a depolarization factor.

Example 18: The integrated imaging system of Example 17, wherein the EM radiation is an incoherent illumination, an active illumination, a passive illumination.

Example 19: The integrated imaging system of Example 17, wherein the orientation of the EM radiation includes the orientation of an electric field of the EM radiation.

Example 20: The integrated imaging system of Example 17, wherein the orientation of the EM radiation includes the orientation of a magnetic field of the EM radiation.

Example 21: The integrated imaging system of Example 1, wherein the integrated image sensor is disposed on an imaging wafer, and the edge processor is disposed on a processing wafer attached to a back surface of the imaging wafer.

Example 22: The integrated imaging system of Example 1, wherein the integrated image sensor is disposed on an imaging wafer, and the edge processor is disposed on the imaging wafer between adjacent ones of the integrated image sensor.

Example 23: An integrated imaging system includes an imaging wafer, an optics wafer disposed over a first surface of the imaging wafer, an array of edge processors, and a control wafer disposed over a second surface of the imaging wafer. The imaging wafer includes an array of integrated image sensors, and each integrated image sensor includes: an array of polarizer pixels configured to filter electromagnetic (EM) radiation and to allow filtered EM radiation having a selected polarization state to pass therethrough; an array of radiation-sensing pixels configured to detect the filtered EM radiation and to generate a signal in response to detecting the filtered EM radiation; and readout circuitry configured to perform analog preprocessing on the signal generated by the radiation-sensing pixels. The optics wafer includes a plurality of focusing elements, each focusing element disposed over a respective one of the array of integrated image sensors. A respective edge processor is configured to: generate first-order primitives and second-order primitives based on the analog preprocessed signal from the readout circuitry of a respective integrated image sensor; and determine a plurality of features of an object located in a field-of-view of the respective integrated image sensor based on the first-order primitives and the second-order primitives. The control wafer includes a plurality of control processors, each control processor configured to control operation of a group of edge processors.

Example 24: The integrated imaging system of Example 23, wherein the array of radiation-sensing pixels includes pixels having different sizes and different integration times.

Example 25: The integrated imaging system of Example 23, wherein the optics wafer includes components having automatic aperture capability.

Example 26: The integrated imaging system of Example 23, further including a processing wafer disposed between the imaging wafer and the control wafer, wherein the array of edge processors is disposed on the processing wafer.

Example 27: The integrated imaging system of Example 23, wherein the array of edge processors is disposed on the imaging wafers, a respective edge processor disposed between adjacent integrated image sensors.

Example 28: The integrated imaging system of Example 23, wherein the integrated wafer-level sensor is configured to operate as a single integrated imaging system.

Example 29: The integrated imaging system of Example 23, wherein the integrated wafer-level sensor is configured to operate as a plurality of imaging arrays.

Example 30: A method includes: providing an imaging wafer including an array of integrated image sensors and stacking an optics wafer on a first surface of the imaging wafer. Each integrated image sensor includes: an array of polarizer pixels configured to filter electromagnetic (EM) radiation and to allow filtered EM radiation having a selected polarization state to pass therethrough; an array of radiation-sensing pixels configured to detect the filtered EM radiation and to generate a signal in response to detecting the filtered EM radiation; and readout circuitry configured to perform analog preprocessing on the signal generated by the radiation-sensing pixels. The optics wafer includes a plurality of focusing elements, each focusing element disposed over a respective one of the array of integrated image sensors.

Example 31: The method of Example 30, further including stacking a processing wafer on a second surface of the imaging wafer opposite the first surface, the processing wafer including an array of edge processors, a respective edge processor configured to: generate first-order primitives and second-order primitives based on the analog preprocessed signal from the readout circuitry of a respective integrated image sensor; and determine a plurality of features of an object located in a field-of-view of the respective integrated image sensor based on the first-order primitives and the second-order primitives.

Example 32: The method of Example 31, including cutting the stack including the imaging wafer and the optics wafer into a plurality of tiles.

Example 33: The method of Example 32, further including arranging the plurality of tiles on a surface of an airplane or a vehicle.

Example 34: The method of Example 32, further including arranging the plurality of tiles to form a linear array, a 2D shape, or a 3D shape.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. An integrated imaging system, comprising:
   an integrated image sensor, comprising:
   a polarizer pixel configured to filter electromagnetic (EM) radiation and to allow filtered EM radiation having a selected polarization state to pass therethrough;
   a radiation-sensing pixel configured to detect the filtered EM radiation and to generate a signal in response to detecting the filtered EM radiation; and
   readout circuitry configured to perform analog preprocessing on the signal generated by the radiation-sensing pixel; and
   a microlens array disposed above the integrated image sensor, the microlens array being configured to focus the electromagnetic radiation on the radiation-sensing pixel;
   an edge processor of an array of edge processors, wherein the edge processor is dedicated to processing signals received from the integrated image sensor and configured to:
   generate first-order primitives and second-order primitives based on the analog preprocessed signal from the readout circuitry; and
   determine a plurality of features of an object located in a field-of-view of the radiation-sensing pixel based on the first-order primitives and the second-order primitives.

2. The integrated imaging system of claim 1, wherein the polarizer pixel is vertically aligned and is disposed over the radiation-sensing pixel, and boundaries of the polarizer pixel coincide with boundaries of the radiation-sensing pixel.

3. The integrated imaging system of claim 2, wherein the boundaries of the polarizer pixel are defined by metal barriers, and the boundaries of the radiation-sensing pixel are defined by metal trench isolation features.

4. The integrated imaging system of claim 3, wherein a material of the metal barriers and the metal trench isolation features includes aluminum, copper, tungsten, tin, chromium, indium, gold, or a combination thereof.

5. The integrated imaging system of claim 3, wherein the radiation-sensing pixel is formed in a semiconductor substrate, and the metal trench isolation features extend from a frontside of the semiconductor substrate to a backside of the semiconductor substrate.

6. The integrated imaging system of claim 1, further comprising a backside illuminated sensor comprising the radiation-sensing pixel.

7. The integrated imaging system of claim 1, further comprising a frontside illuminated sensor comprising the radiation-sensing pixel.

8. The integrated imaging system of claim 1, wherein the polarizer pixel is integrated into the radiation-sensing pixel.

9. The integrated imaging system of claim 8, wherein the polarizer pixel is disposed at an anode level or a cathode level of the radiation-sensing pixel.

10. The integrated imaging system of claim 1, wherein the polarizer pixel comprises one or more material constructs exhibiting birefringence and including plenoptic 3D, a structure including one or more meta-materials, antenna structures, aligned quantum dots, aligned carbon nanotubes, subwavelength structures other than meta-materials, or a combination thereof.

11. The integrated imaging system of claim 1, wherein the polarizer pixel comprises a grid of metal wires having a selected orientation, and a line width and pitch of the grid of metal wires is less than a wavelength of the filtered EM radiation.

12. The integrated imaging system of claim 11, wherein the polarizer pixel is configured to be sensitive to the wavelength of the filtered EM radiation based on the line width and the pitch of the grid of metal wires.

13. The integrated imaging system of claim 12, wherein a material of the grid of metal wires includes aluminum, copper, tungsten, tin, chromium, indium, gold, or a combination thereof.

14. The integrated imaging system of claim 1, wherein the radiation-sensing pixel comprises an electromagnetic detector configured to be sensitive to EM wavelengths in a visible light range, a near infrared range, a short-wave infrared range, a mid-wave infrared range, a long-wave infrared range, an ultraviolet range, a microwave range, an X-ray range, a Gamma ray range, a radio-frequency range, or a terahertz range.

15. The integrated imaging system of claim 1, wherein the plurality of features comprises:
a full rendering of the object and a scene;
a distance of the object from the integrated imaging system, machine vision analysis of the object and the scene; and
a three-dimensional model or image of the object, a frequency distribution of electromagnetic radiation emanating from the object, angles of one or more surfaces or shapes of the object, surface normal vectors associated with the one or more surfaces of the object, velocity and acceleration of the surface normal vectors, an identification of a material of the object, interior volume features of the object, gradients of the object, segmentation of the object, surface features within segments of the object, or a combination thereof.

16. The integrated imaging system of claim 1, wherein the edge processor is further configured to identify, characterize, quantify, replicate, or determine a variation of the features determined by the edge processor.

17. The integrated imaging system of claim 1, wherein at least one of the first-order primitives or the second-order primitives comprises at least one of an orientation of EM radiation emitted by, reflected off, or transmitted through the object, a degree of linear polarization of the EM radiation, an amount of unpolarized scatter of the EM radiation, a primary angle of reflected linearly polarized EM radiation, an ellipticity of the EM radiation, albedo, an index of refraction of a material of the object, an angle of linear polarization, a degree of linear polarization, or a depolarization factor.

18. The integrated imaging system of claim 17, wherein the EM radiation is an incoherent illumination, an active illumination, or a passive illumination.

19. The integrated imaging system of claim 17, wherein the orientation of the EM radiation comprises an orientation of an electric field of the EM radiation.

20. The integrated imaging system of claim 17, wherein the orientation of the EM radiation comprises an orientation of a magnetic field of the EM radiation.

21. The integrated imaging system of claim 1, wherein the integrated image sensor is disposed on an imaging wafer, and the edge processor is disposed on a processing wafer attached to a back surface of the imaging wafer.

22. The integrated imaging system of claim 1, wherein the integrated image sensor is disposed on an imaging wafer, and the edge processor is disposed on the imaging wafer between adjacent ones of the integrated image sensor.

23. An integrated imaging system, comprising:
an imaging wafer comprising an array of integrated image sensors, each integrated image sensor, comprising:
an array of polarizer pixels configured to filter electromagnetic (EM) radiation and to allow filtered EM radiation having a selected polarization state to pass therethrough;
an array of radiation-sensing pixels configured to detect the filtered EM radiation and to generate a signal in response to detecting the filtered EM radiation; and
readout circuitry configured to perform analog preprocessing on the signal generated by the radiation-sensing pixels;
an optics wafer disposed over a first surface of the imaging wafer, the optics wafer comprising a plurality of microlens arrays, each microlens of the microlens array disposed over a respective one of the array of integrated image;
an array of edge processors, a respective edge processor of the array of edge processors dedicated to processing signals received from a respective integrated image sensor and configured to:
generate first-order primitives and second-order primitives based on the analog preprocessed signal from the readout circuitry of a respective integrated image sensor; and
determine a plurality of features of an object located in a field-of-view of the respective integrated image sensor based on the first-order primitives and the second-order primitives; and
a control wafer disposed over a second surface of the imaging wafer, the control wafer comprising a plurality of control processors, each control processor configured to control operation of a group of edge processors.

24. The integrated imaging system of claim 23, wherein the array of radiation-sensing pixels includes pixels having different sizes and different integration times.

25. The integrated imaging system of claim 23, wherein the optics wafer includes components having automatic aperture capability.

26. The integrated imaging system of claim 23, further comprising a processing wafer disposed between the imaging wafer and the control wafer, wherein the array of edge processors is disposed on the processing wafer.

27. The integrated imaging system of claim 23, wherein the array of edge processors is disposed on the imaging wafers, a respective edge processor disposed between adjacent integrated image sensors.

28. The integrated imaging system of claim 23, wherein the imaging wafer is configured to operate as a single integrated imaging system.

29. The integrated imaging system of claim 23, wherein the imaging wafer is configured to operate as a plurality of imaging arrays.

30. A method, comprising:
providing an imaging wafer comprising an array of integrated image sensors, each integrated image sensor, comprising:

an array of polarizer pixels configured to filter electromagnetic (EM) radiation and to allow filtered EM radiation having a selected polarization state to pass therethrough;

an array of radiation-sensing pixels configured to detect the filtered EM radiation and to generate a signal in response to detecting the filtered EM radiation; and readout circuitry configured to perform analog preprocessing on the signal generated by the radiation-sensing pixels;

providing an array of edge processors, each edge processor of the array of edge processors being dedicated to processing signals received from a respective one of the array of integrated image sensors; and stacking an optics wafer on a first surface of the imaging wafer, the optics wafer; comprising a plurality of microlens arrays, each microlens of the microlens array disposed over a respective one of the array of integrated image sensors.

31. The method of claim 30, further comprising stacking a processing wafer on a second surface of the imaging wafer opposite the first surface, the processing wafer comprising the array of edge processors, a respective edge processor configured to:

generate first-order primitives and second-order primitives based on the analog preprocessed signal from the readout circuitry of a respective integrated image sensor; and determine a plurality of features of an object located in a field-of-view of the respective integrated image sensor based on the first-order primitives and the second-order primitives.

32. The method of claim 31, comprising cutting the stack including the imaging wafer and the optics wafer into a plurality of tiles.

33. The method of claim 32, further comprising arranging the plurality of tiles on a surface of an airplane or a vehicle.

34. The method of claim 32, further comprising arranging the plurality of tiles to form a linear array, a 2D shape, or a 3D shape.

* * * * *